(12) United States Patent
Nagano

(10) Patent No.: US 6,275,020 B1
(45) Date of Patent: Aug. 14, 2001

(54) FREQUENCY ANALYSIS METHOD AND SWEEP TYPE SPECTRUM ANALYZER

(75) Inventor: Masao Nagano, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/312,156

(22) Filed: May 14, 1999

(30) Foreign Application Priority Data

May 14, 1998 (JP) .................................................. 10-131687

(51) Int. Cl.[7] ............................. G01R 23/16; G01R 13/24
(52) U.S. Cl. ..................................... 324/76.27; 324/76.19
(58) Field of Search ............................ 324/76.19, 76.21, 324/76.23, 76.24, 76.26, 76.27

(56) References Cited

U.S. PATENT DOCUMENTS

| | | | |
|---|---|---|---|
| 3,876,946 | * 4/1975 | La Clair et al. | 324/76.23 |
| 4,451,782 | * 5/1984 | Ashida | 324/76.26 |
| 4,568,878 | * 2/1986 | Bales | 324/76.23 |
| 4,672,308 | * 6/1987 | Leikus | 324/76.23 |
| 4,918,382 | * 4/1990 | Bales et al. | 324/76.22 |
| 5,168,213 | * 12/1992 | Wardle et al. | 324/76.27 |
| 5,736,845 | * 4/1998 | Kosuge | 324/76.27 |
| 5,939,887 | * 8/1999 | Schmidt et al. | 324/76.19 |
| 6,140,809 | 10/2000 | Doi | 324/76.24 |
| 6,166,533 | * 12/2000 | Musha | 324/76.27 |
| 6,191,571 | * 2/2001 | Fukui et al. | 324/76.26 |

FOREIGN PATENT DOCUMENTS 19734040   2/1998  (DE) .

OTHER PUBLICATIONS

Fischer, Wolfgang, "Audio Analyzer UPA mit neuen Leistungsmerkmalen," Neues von Rhode & Wscharz 118 Sommer 1987, pp. 9–12.

* cited by examiner

Primary Examiner—Glenn W. Brown
(74) Attorney, Agent, or Firm—Gallagher & Lathrop; David N. Lathrop

(57) ABSTRACT

There are provided a frequency analysis method permitting a frequency analysis to be performed at a high rate and a sweep type spectrum analyzer using such frequency analysis method. In the case of multiplying a signal to be measured by a main swept frequency signal; extracting the result of the multiplication through an intermediate frequency filter having a predetermined bandwidth to extract frequency components included in the signal to be measured as intermediate frequency signals; and analyzing the frequency components included in the signal to be measured based on the correspondence relation between a power of each of the intermediate frequency signals and a frequency of the main swept frequency signal, an inverse swept signal is multiplied by each intermediate frequency signal, the inverse swept signal being frequency-swept in the reverse direction to the frequency transition direction of the associated intermediate frequency signal, and a constant frequency component obtained from the results of the multiplications is extracted as a frequency spectrum included in the signal to be measured.

20 Claims, 16 Drawing Sheets

PRIOR ART

FREQUENCY ANALYSIS METHOD AND SWEEP TYPE SPECTRUM ANALYZER

BACKGROUND OF THE INVENTION

1. Field of the Invention

The present invention relates to a frequency analysis method utilized in analyzing frequency components included in various kinds of signals and to a sweep type spectrum analyzer using this frequency analysis method, and more particularly, relates to a frequency analysis method which permits such spectrum analyzer to be swept at high or fast rates (speeds) even in a high resolution analysis and to a sweep type spectrum analyzer using such frequency analysis method.

2. Description of the Related Art

There have been two types of spectrum analyzers, one of which is referred to a sweep type spectrum analyzer and the other of which is an FFT (fast Fourier transform) type spectrum analyzer in correspondence to different methods of frequency analysis.

The sweep type spectrum analyzer means a spectrum analyzer of the type in which a local oscillator continuously performs a frequency sweep operation, a frequency spectrum component included in a signal to be measured is converted, by the frequency sweep operations, into an intermediate frequency signal consisting of a constant frequency component, and the power of the intermediate frequency signal is detected and displayed, as a spectrum component, on a screen of a cathode ray tube.

The FFT type spectrum analyzer means a spectrum analyzer of the type in which the oscillation frequency of a local oscillator is changed stepwise, the oscillation frequency in each step is resolved into a spectrum by the FFT transform means, and the Fourier transform results obtained in all of those steps are stored in a memory and are displayed on a display device.

The sweep type spectrum analyzer has a characteristic that all the frequency analysis results can be obtained by one frequency sweep operation. However on the other hand, there is a disadvantage in this type of spectrum analyzer that a time length required for one frequency analysis (time length of frequency sweep) must be longer as frequency resolution is made higher.

On the contrary, the time length required for a frequency analysis in the FFT type spectrum analyzer may be shorter than that required for the sweep type spectrum analyzer. However on the other hand, there is a disadvantage in this type of spectrum analyzer that since frequency analysis operation is performed stepwise, the frequency analysis results become discrete and hence all the spectrum components included in a signal to be measured cannot be extracted precisely.

As mentioned above, each of the sweep type spectrum analyzer and the FFT type spectrum analyzer has both merits and demerits. However, it can be said that if the sweep type spectrum analyzer can have a possibility of high rate sweep operations, the sweep type spectrum analyzer has a characteristic superior than that of the FFT type spectrum analyzer.

The reason why the sweep rates or speeds of the sweep type spectrum analyzer cannot be made higher is described in many technical books or journals (for example, "Spectrum Analyzer—Theory and Application" written by Morris Engelson and Fred Telewsky, translated by Kiyotaka Okada, and published by Nikkan Kogyo Shinbun Co., Ltd.; "Spectrum/Network Analyzer" written by Robert A. Witte, translated by Teruo Takeda and Nobutaka Arai, and published by Toppan Co., Ltd., and the like). Therefore, in this specification, such reason will be described very simply by concentrating on the items necessary for understanding the present invention.

First, a basic configuration of a sweep type spectrum analyzer will be described. FIG. 13 shows a configuration of a conventional sweep type spectrum analyzer in a mostly simplified form. As shown, the spectrum analyzer can basically be configured by a mixer 12, a local oscillator 13, an intermediate frequency filter 14, a sawtooth wave generator 15, and a display device 16. The mixer 12, the local oscillator 13 and the intermediate frequency filter 14 constitute, as will be mentioned later, a time-to-frequency converting apparatus 18.

The local oscillator 13 performs a frequency sweep over a preset frequency span or range $f_{LO}-f_{HI}$, and inputs the swept frequency signal LO to the mixer 12. The mixer 12 mixes the swept frequency signal inputted thereto from the local oscillator 13 and a signal to be measured $S_{in}$ inputted to an input terminal 11, and outputs, in this example, a difference signal between those two signals. Assuming that the center frequency of the passband of the intermediate frequency filter 14 is $f_{IF}$, if the signal to be measured $S_{in}$ includes signals $S_1$, $S_2$ and $S_3$ having frequencies $f_1$, $f_2$ and $f_3$ ($f_1<f_2<f_3$) respectively, intermediate frequency signals $S_{IF1}$, $S_{IF2}$ and $S_{IF3}$ can be extracted through the intermediate frequency filter 14 every time the frequency $f_{LO}$ of the swept frequency signal LO satisfies conditions of $f_{LO}-f_1=f_{IF}$, $f_{LO}-f_2=f_{IF}$, and $f_{LO}-f_3=f_{IF}$, respectively.

By supplying the intermediate frequency signals $S_{IF1}$, $S_{IF2}$ and $S_{IF3}$ extracted from the intermediate frequency filter 14 to a vertical input terminal Y of the display device 16, and by supplying a sawtooth wave signal $S_W$ outputted from the sawtooth wave generator 15 to a horizontal input terminal X of the display device 16, the intermediate frequency signals $S_{IF1}$, $S_{IF2}$ and $S_{IF3}$ are displayed on the display device 16 the abscissa X of which is made a frequency axis, in order (sequence) of the frequencies $f_1$, $f_2$ and $f_3$ ($f_1<f_2<f_3$) respectively.

The example shown in FIG. 13 is a case in which the intermediate frequency signals $S_{IF1}$, $S_{IF2}$ and $S_{IF3}$ extracted from the intermediate frequency filter 14 are directly inputted to a vertical input terminal Y of the display device 16. However, there is another case in which, as shown in FIG. 14, a detector 17 is disposed at the output side of the intermediate frequency filter 14, and the intermediate frequency signals $S_{IF1}$, $S_{IF2}$ and $S_{IF3}$ are detected by the detector 17, and thereafter, this detected signal is supplied to the vertical input terminal Y of the display device 16 to display frequency spectrums $S_{IF11}$, $S_{IF12}$ and $S_{IF13}$ having a rectified and smoothed single polar envelope.

In a practical case, since the bandwidth of the intermediate frequency filter 14 is narrow as compared with the frequency sweeping range (span) or swept frequency bandwidth of the local oscillator 13, the frequency spectrums $S_{IF11}$, $S_{IF12}$ and $S_{IF13}$ are observed, as shown in FIG. 15, as line spectrums respectively if each of the signals $S_1$, $S_2$ and $S_3$ included in the signal to be measured $S_{in}$ is a sine wave having single frequency.

From the above discussion, it could be understood that the signals $S_1$, $S_2$ and $S_3$ included in the signal to be measured $S_{in}$ can be frequency-discriminated and can be converted, by the mixer 12, the local oscillator 13 for generating a frequency sweep signal and the intermediate frequency filter 14, to the intermediate frequency signals $S_{IF1}$, $S_{IF2}$ and $S_{IF3}$ aligned on the time base in accordance with a lapse of time associated with the frequency sweep operation. Therefore, hereinafter, the frequency discriminating/converting means constituted by the mixer 12, the local oscillator 13 and the intermediate frequency filter 14 will be referred to as time-to-frequency converting apparatus or converter 18.

Here, attention is paid to the intermediate frequency signal $S_{IF1}$ shown in FIG. 13. FIG. 16 shows a behavior in which the intermediate frequency filter 14 responds to a signal $Smix_1$ having a difference frequency $f_{LO}-f_1$ outputted from the mixer 12.

Now, assuming that the center frequency of the intermediate frequency filter 14 is 10 MHz, the passband width of the intermediate frequency filter 14 defined by −3 dB is ±1 MHz, the frequency $f_1$ of the signal $S_1$ is $f_1$=100 MHz, if the oscillation frequency $f_{LO}$ of the local oscillator 13 approaches 109 MHz at sufficiently slow speed, $f_{LO}-f_1=f_{IF}$ is 109−100=9 MHz, and the frequency of the signal $Smix_1$ falls into the passband width of the intermediate frequency filter 14. As a result, the intermediate frequency filter 14 starts to respond to the inputted signal $Smix_1$ and to output at its output side an intermediate frequency signal $B_1$ having 9 MHz frequency.

When $f_{LO}$ approaches 110 MHz, the difference frequency becomes $f_{LO}-f_1$=10 MHz. Therefore, at this point in time, a signal outputted from the intermediate frequency filter 14 is a signal $B_2$ having a frequency 10 MHz. Since the frequency 10 MHz of this signal $B_2$ is equal to the center frequency of the intermediate frequency filter 14, the signal $B_2$ has the maximum amplitude.

After the local oscillation frequency $f_{LO}$ exceeds 110 MHz, the amplitude of the intermediate frequency signal is gradually decreased. When the local oscillation frequency $f_{LO}$ approaches 111 MHz, the frequency of the signal $Smix_1$ outputted from the intermediate frequency filter 14 approaches 11 MHz. The amplitude of the signal $B_3$ outputted at this point in time is sufficiently small.

After the local oscillation frequency $f_{LO}$ exceeds 111 MHz, the intermediate frequency filter 14 gradually stops responding to the inputted signal $Smix_1$ since the frequency of the signal $Smix_1$ goes out of the passband of the intermediate frequency filter 14.

When the amplitude changes of the signals $B_1$, $B_2$ and $B_3$ shown in FIG. 16B are connected or joined together, the intermediate frequency signal $S_{IF1}$ shown in FIG. 16C is obtained. The amplitude of this intermediate $S_{IF1}$ is proportional to the amplitude of the input signal $S_1$. That is, the content ratios or percentages of the input signals $S_1$, $S_2$ and $S_3$ are displayed as the amplitude ratios of the intermediate frequency signals. In addition, even if the frequencies $f_1$, $f_2$, and $f_3$ of the input signals $S_1$, $S_2$ and $S_3$ are mutually different frequencies, the intermediate frequency signal can always be extracted as a signal having a constant swept frequency bandwidth, in this example, having the swept frequencies ranging from 9 MHz to 11 MHz.

As previously noted, when the oscillation frequency $f_{LO}$ of the local oscillator 13 is swept at a sufficiently low speed, the envelopes $A_1$, $A_2$ and $A_3$ (refer to FIG. 13) of the amplitudes of the intermediate frequency signals $S_{IF1}$, $S_{IF2}$ and $S_{IF3}$ faithfully reproduce the filter characteristics of the intermediate frequency filter 14. Therefore, the correct spectrum frequencies and the power values of the respective spectrums can be displayed.

On the contrary, when the oscillation frequency $f_{LO}$ of the local oscillator 13 is swept at a high rate, as shown in FIG. 16D, the envelopes of the intermediate frequency signals $S_{IF1}$, $S_{IF2}$ and $S_{IF3}$ produce two errors, i.e., a phenomenon that the peak frequency is shifted to the high frequency side from the center frequency of the intermediate frequency filter 14, and a drawback that the peak level is reduced. In addition, when the sweep rate is further increased, as shown in FIG. 16E, substantially the entire range of the swept frequency span (bandwidth) of the local oscillator 13 has a flat characteristic.

The explanation of the mechanism that causes the above two errors will be entrusted to the aforementioned various technical books, and the occurrence of such errors is the reason why the sweep rate or speed of the sweep type spectrum analyzer cannot be increased more and more.

Limit of the sweep rate of the sweep type spectrum analyzer generally spoken is defined as $0.5 \times RBW^2$. In this case, the RBW is a passband width of a filter determining a frequency resolution of a sweep type spectrum analyzer. Therefore, in the aforementioned example, the RBW corresponds to the passband width of the intermediate frequency filter 14. As is apparent from this definition, when the passband width RBW of the filter is made narrower in order to increase the resolution, the square value of the passband width RBW is decreased in inverse proportion. For example, when the passband width is 10 Hz, its square value is 100, when the passband width is 5 Hz, its square value is 25, and when the passband width is 1 Hz, its square value is 1. Therefore, there occurs a drawback that the sweep rate of the sweep type spectrum analyzer must be lowered in inverse proportion to the square of the passband width RBW of the filter as RBW is decreased.

There have been proposed various attempts for increasing more and more the sweep rate of the sweep type spectrum analyzer. As an example of those attempts, for example, there is an invention described in the Japanese Patent Application Laid Open No. Hei 4-221777 (221777/1992).

FIG. 17 shows a configuration of the spectrum analyzer described in the official gazette of the Japanese Patent Application. In FIG. 17, an external input terminal 11 is connected, similarly to the conventional spectrum analyzer, to a mixer 12 of a time-to-frequency converting apparatus 18 constituted by the mixer 12, a local oscillator 13 and an intermediate frequency filter 14. The intermediate frequency signals arranged along the time base by this time-to-frequency converting apparatus 18 are converted to digital signals by an AD (analog-to-digital) converter 19 and the digital signals are inputted to a quadrature detector 20, by which the digital signals are converted to complex signals. Each of the complex signals is inputted to a resolution filter 21, by which the complex signal is multiplied by the narrow band resolution filter characteristic through a convolution operation to determine the resolution. The power of the complex signal is detected through the resolution filter 21 and its spectrum components are stored in a memory 22. The spectrum components stored in the memory 22 are supplied to a display device 16 via a controller (CPU) 23 configured by a microcomputer, thereby displaying the spectrum components on the display device 16.

In addition, in the invention of the aforementioned Japanese Patent Application, the spectrum analyzer is constructed such that there is provided a calibration memory 24, by which the error that the spectrum power is reduced and the frequency shift error produced by sweeping at a high rate are compensated, and then the compensated spectrum is displayed on the display 16.

In the invention described in the Japanese Patent Application Laid Open No. Hei 4-221777, there is no teaching or suggestion at all that the power reduction error and the frequency shift error produced by sweeping at a high rate should be removed, and there is merely proposed a technical concept for compensating the already produced errors so as to apparently show the obtained data as if they were correct data. In the invention of the Japanese Patent Application, it is insisted that, as the result of high rate sweeping, the sweep rate comes to $2.266 \times RBW^2$, that is, "the sweep rate=$2.266 \times RBW^2$". As compared with the conventionally defined sweep rate limit of $0.5 \times RBW^2$, this result of high rate sweeping ($2.266 \times RBW^2$) is only approximately four times the conventional sweep rate of $0.5 \times RBW^2$, and the square term of the passband width RBW of the resolution filter remains still untouched. Therefore, it cannot be said that a true high rate or speed in sweeping has been attained.

SUMMARY OF THE INVENTION

It is an object of the present invention to provide a frequency analysis method which enables a resolution filter having narrow band characteristics to respond at a high speed and makes it possible to eliminate the square term of the passband width RBW.

It is another object of the present invention to provide a sweep type spectrum analyzer using the above frequency analysis method in which a true high rate in sweeping operation is attained.

In order to accomplish the above-mentioned objects, in a first aspect of the present invention, there is provided a frequency analysis method which comprises the steps of: multiplying a signal to be measured by a main swept frequency signal; extracting the result of the multiplication through an intermediate frequency filter having a predetermined bandwidth to take out frequency components included in the signal to be measured as intermediate frequency signals arranged in the direction of time base; and analyzing the frequency components included in the signal to be measured based on the correspondence relation between a power of each of the intermediate frequency signals and a frequency of the main swept frequency signal, the method fuirther comprising the steps of: multiplying each intermediate frequency signal by an inverse swept signal, the inverse swept signal being frequency-swept in the reverse direction to the frequency transition direction of the associated intermediate frequency signal; and extracting a constant frequency component obtained from the results of the multiplications as a frequency spectrum included in the signal to be measured.

The frequency-sweeping span of the inverse swept signal is set to a bandwidth narrower than the passband width of the intermediate frequency filter, and the inverse swept frequency operation is repeated a plurality of times without intermission during the main swept frequency operation, and a power of a constant frequency component obtained from each of the inverse swept frequency operations is extracted as a frequency spectrum.

In a preferred embodiment, the constant frequency component obtained from the results of the multiplications is a signal component the frequency of which coincides with the center frequency of a resolution filter.

In a second aspect of the present invention, there is provided a sweep type spectrum analyzer comprising a time-to-frequency converting means which is constituted by a local oscillator for generating a main swept frequency signal; means for multiplying the main swept frequency signal generated from the local oscillator by a signal to be measured; and an intermediate frequency filter having a bandpass characteristic, and is arranged such that a frequency component included in the signal to be measured is frequency-discriminated in accordance with a lapse of time associated with the swept frequency operation of the local oscillator thereby converting the frequency-discriminated components to intermediate frequency signals arranged on the time base, the sweep type spectrum analyzer further comprising: multiplier means for multiplying each of the intermediate frequency signals outputted from the time-to-frequency converting means by an inverse swept signal, the inverse swept signal being frequency-swept in the reverse direction to the frequency transition direction of the associated intermediate frequency signal; and a resolution filter supplied with the results of the multiplications of the multiplier means for extracting a signal having a constant frequency, whereby a power of each signal extracted through the resolution filter is displayed on a display device as a frequency spectrum included in the signal to be measured.

In a preferred embodiment, the inverse swept signal is generated from a secondary local oscillator, and the frequency-sweeping span of the inverse swept signal is set to a bandwidth narrower than the passband width of the intermediate frequency filter. The multiplication of the inverse swept signal by the intermediate frequency signal is repeated a plurality of times during the main swept frequency operation, and each of the results of the multiplications is supplied to the resolution filter. In addition, the constant frequency component extracted through the resolution filter is a signal component the frequency of which coincides with the center frequency of the resolution filter.

In a third aspect of the present invention, there is provided a sweep type spectrum analyzer comprising a time-to-frequency converting means which is constituted by a local oscillator for generating a main swept frequency signal; means for multiplying the main swept frequency signal generated from the local oscillator by a signal to be measured; and an intermediate frequency filter having a bandpass characteristic, and is arranged such that a frequency component included in the signal to be measured is frequency-discriminated in accordance with a lapse of time associated with the swept frequency operation of the local oscillator thereby converting the frequency-discriminated components to intermediate frequency signals arranged on the time base, the sweep type spectrum analyzer further comprising a plurality of inverse chirp correction units provided in parallel with each other. Each of the inverse chirp correction units comprises: multiplier means for multiplying each of the intermediate frequency signals outputted from the time-to-frequency converting means by an inverse swept signal, the inverse swept signal being frequency-swept in the reverse direction to the frequency transition direction of the associated intermediate frequency signal; a resolution filter supplied for extracting a signal component having a constant frequency from a signal outputted from the multiplier means; a detector for detecting the signal component extracted through the resolution filter; and a sample-and-hold circuit for sampling and holding the detected output from the detector every time the sweeping operation by the inverse swept signal ends, and the plurality of inverse chirp correction units are sequentially operated repetitively with a time difference therebetween, and sample-hold signals of the sample-and-hold circuits obtained every operation of the inverse chirp correction units are sequentially outputted.

The output signal from the sample-and-hold circuit of each of the plurality of inverse chirp correction units is inputted into the vertical axis of a display device, and a sawtooth wave in synchronism with the main swept frequency signal is inputted into the horizontal axis of the display device, thereby to display the frequency spectrum of a signal to be measured.

In a preferred embodiment, in each of the plurality of inverse chirp correction units, the inverse swept signal is generated from a secondary local oscillator, and the frequency-sweeping span of the inverse swept signal is set to a bandwidth narrower than the passband width of the intermediate frequency filter. The multiplication of the inverse swept signal by the intermediate frequency signal is repeated a plurality of times during the main swept frequency operation, and each of the results of the multiplications is supplied to the resolution filter. In addition, the constant frequency component extracted through the resolution filter is a signal component the frequency of which coincides with the center frequency of the resolution filter.

In a fourth aspect of the present invention, there is provided a sweep type spectrum analyzer comprising a time-to-frequency converting means which is constituted by a local oscillator for generating a main swept frequency signal; means for multiplying the main swept frequency signal generated from the local oscillator by a signal to be measured; and an intermediate frequency filter having a bandpass characteristic, and is arranged such that a frequency component included in the signal to be measured is frequency-discriminated in accordance with a lapse of time associated with the swept frequency operation of the local oscillator thereby converting the frequency-discriminated components to intermediate frequency signals arranged on the time base, the sweep type spectrum analyzer further comprising: a quadrature detector provided at the output side of the time-to-frequency converting means; a plurality of inverse chirp correction units provided in parallel with each other. Each of the inverse chirp correction units comprises: a pair of multipliers for multiplying an inverse swept signal by a real part signal and by an imaginary part signal outputted from the quadrature detector respectively, the inverse swept signal being frequency-swept in the reverse direction to the frequency transition direction of the associated intermediate frequency signal; a pair of low-pass filters each constituting the resolution filter, each of the low-pass filters extracting a base band signal obtained from the result of the multiplication of the associated multiplier; a pair of square operation circuits for squaring the output signals from the pair of low-pass filters, respectively; an adder for summing up the results of square operations by the pair of square circuits to find a power of a frequency spectrum included in the signal to be measured; a detector for detecting the result of the addition operated by the adder; and a sample-and-hold circuit for sampling and holding the detected output from the detector every time the sweeping operation by the inverse swept signal ends, and the plurality of inverse chirp correction units are sequentially operated repetitively with a time difference therebetween, and sample-hold signals of the sample-and-hold circuits obtained every operation of the inverse chirp correction units are sequentially outputted.

The output signal from the sample-and-hold circuit of each of the plurality of inverse chirp correction units is inputted into the vertical axis of a display device, and a sawtooth wave in synchronism with the main swept frequency signal is inputted into the horizontal axis of the display device, thereby to display the frequency spectrum of a signal to be measured.

In a preferred embodiment, in each of the plurality of inverse chirp correction units, the inverse swept signal is generated from a secondary local oscillator, and the frequency-sweeping span of the inverse swept signal is set to a bandwidth narrower than the passband width of the intermediate frequency filter. The multiplications of the inverse swept signal by the real part signal and by the imaginary part signal outputted from the quadrature detector are repeated a plurality of times during the main swept frequency operation, and each of the results of the multiplications is supplied to the associated low-pass filter.

In a fifth aspect of the present invention, there is provided a sweep type spectrum analyzer comprising a time-to-frequency converting means which is constituted by a local oscillator for generating a main swept frequency signal; means for multiplying the main swept frequency signal generated from the local oscillator by a signal to be measured; and an intermediate frequency filter having a bandpass characteristic, and being arranged such that a frequency component included in the signal to be measured is frequency-discriminated in accordance with a lapse of time associated with the swept frequency operation of the local oscillator thereby converting the frequency-discriminated components to intermediate frequency signals arranged on the time base, the sweep type spectrum analyzer farther comprising: an analog-to-digital converter provided at the output side of the time-to-frequency converting means and supplied with an intermediate frequency signal; a quadrature detector supplied with a digital output from the analog-to-digital converter; a memory for storing therein a digital output from the analog-to-digital converter obtained during the time interval in which the swept frequency operation is performed; an inverse chirp correction means for performing an inverse chirp correction operation using the data stored in the memory; and a resolution filter supplied with an output signal from the inverse chirp correction means. The quadrature detector, the memory, the inverse chirp correction means, and the resolution filter are formed by digital circuits, respectively.

In a preferred embodiment, data selecting means formed by a digital circuit is provided between the quadrature detector and the inverse chirp correction means, the data selecting means being constituted by a decimation filter. In addition, the inverse chirp correction means and the resolution filter are constructed by an arithmetic and logic unit.

To sum up, there are provided, in the present invention, a frequency analysis method by which a frequency of a signal to be inputted to a resolution filter which is limited to have the narrowest band characteristic among signal transmission paths in the spectrum analyzer is fixed to a frequency identical to the center frequency of the resolution filter and a signal having a constant frequency is extracted, which is deemed to be a frequency component included in a signal to be measured, and a spectrum analyzer using such frequency analysis method.

According to the frequency analysis method of the present invention, a frequency of a signal to be inputted to the resolution filter having narrow band characteristic can be fixed to the center frequency of the passband of the resolution filter. As a result, since there is no frequency transition at all on the signal passing through the resolution filter, the resolution filter can quickly respond. The limit of the sweep rate eventually becomes $0.5 \times Bd \times RBW$.

In this case, Bd is a passband width of a circuit portion (element) having the second narrowest passband width next to the resolution filter among the signal transmission paths in the spectrum analyzer. Usually this passband width is approximately ¼ of a sampling frequency of an A/D (analog-to-digital) converter. Therefore, for example, in the case of Bd=10 KHz and RBW=10 Hz;

according to the aforementioned conventional method, the sweep rate is $0.5 \times 10^2 = 5 \times 10$, and according to the invention described in the Japanese Patent Application Laid Open No. Hei 4-221777, the sweep rate is $2.266 \times 10^2 = 22.66 \times 10$.

On the contrary, according to the present invention, the sweep rate is $0.5 \times 10 \times 10^3 \times 10 = 5 \times 10^4$.

Therefore, according to the present invention, a high sweep rate of about 1000 times that of the conventional method can be achieved. Moreover, as compared with the invention described in the Japanese Patent Application Laid Open No. Hei 4-221777, a high sweep rate of about 220 times that of the Japanese Patent Application can be realized.

DETAILED DESCRIPTION OF THE PREFERRED EMBODIMENTS

The preferred embodiments of the present invention will be now described in detail with reference to FIGS. 1 to 12.

Figure 1:
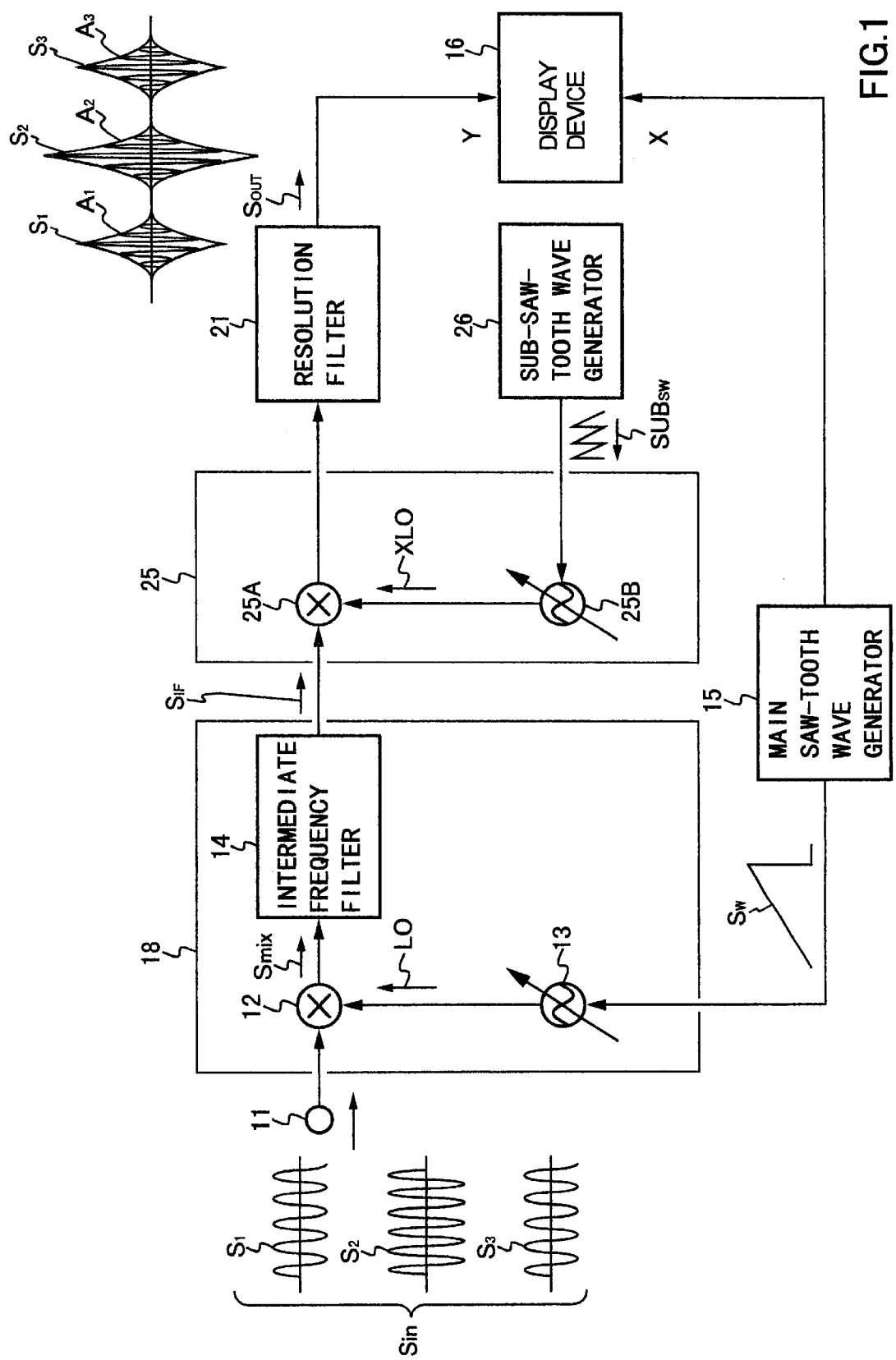
FIG. 1 is a block diagram showing a basic circuit configuration of a sweep type spectrum analyzer to which a frequency analysis method acecding to the present invention can be applied.
Figure 13:
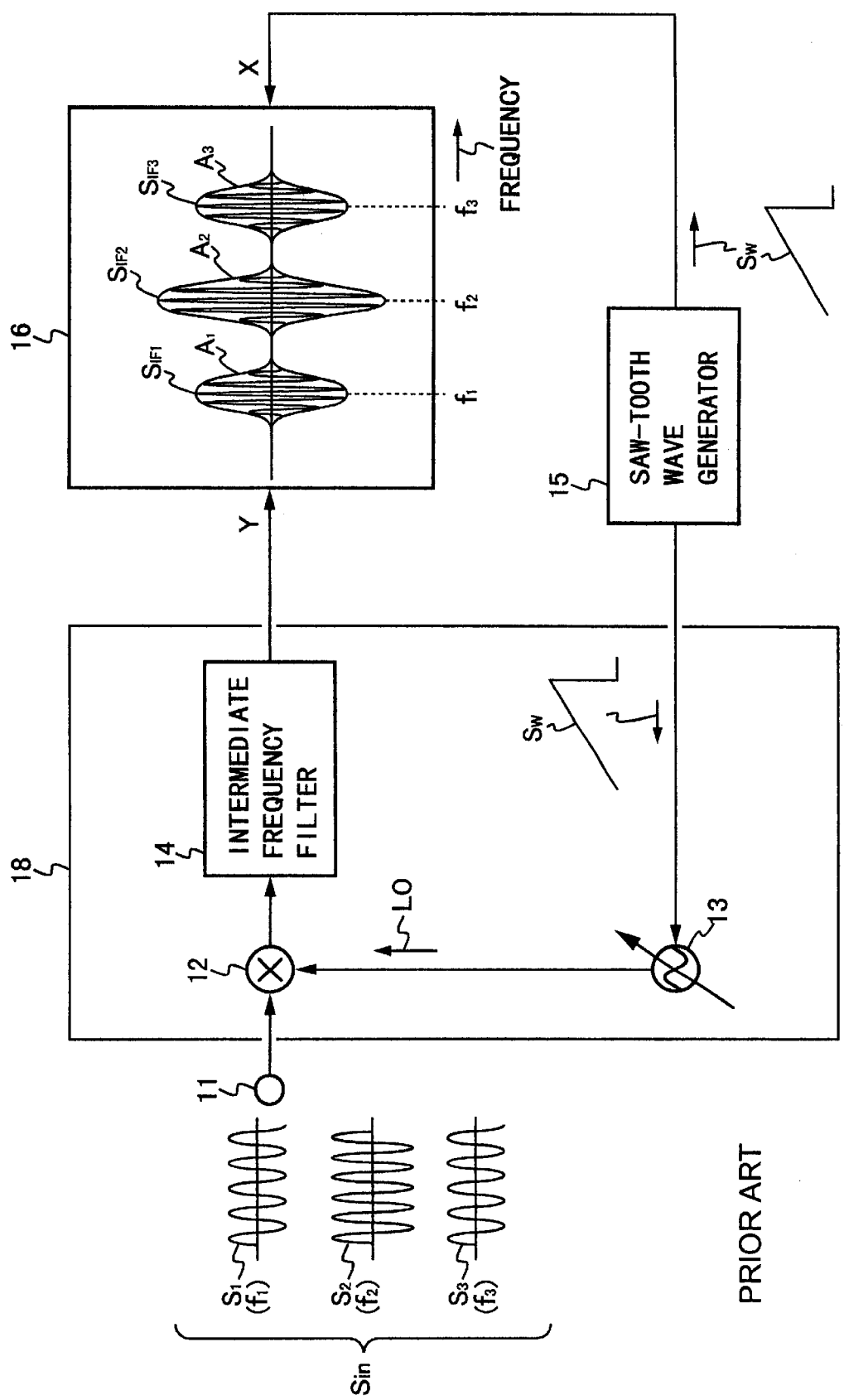
FIG. 13 is a block diagram showing a basic circuit configuration of a conventional sweep type spectrum analyzer.
Figure 14:
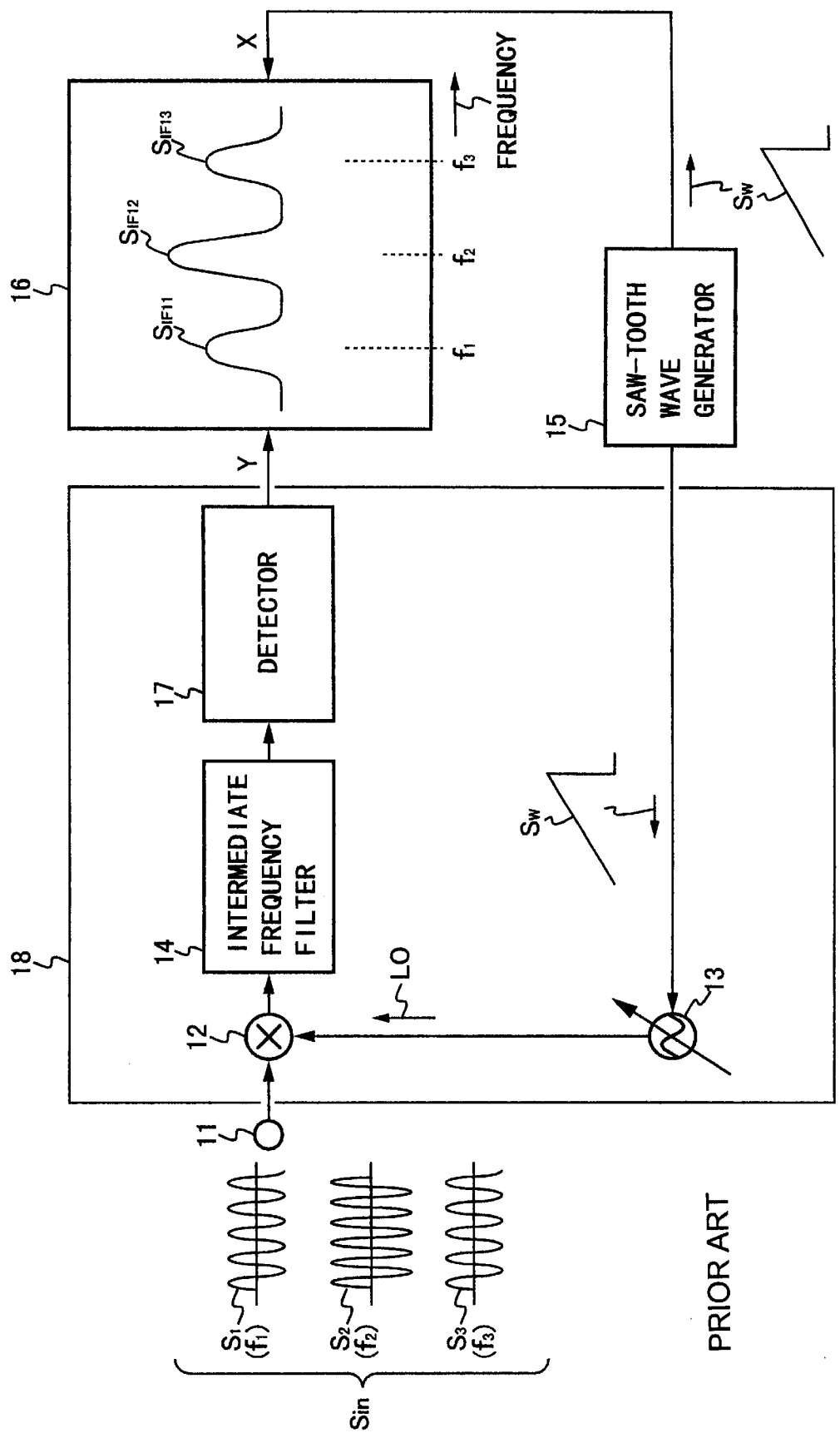
FIG. 14 is a block diagram showing a basic circuit configuration of another example of the conventional sweep type spectrum analyzer.
Figure 15:
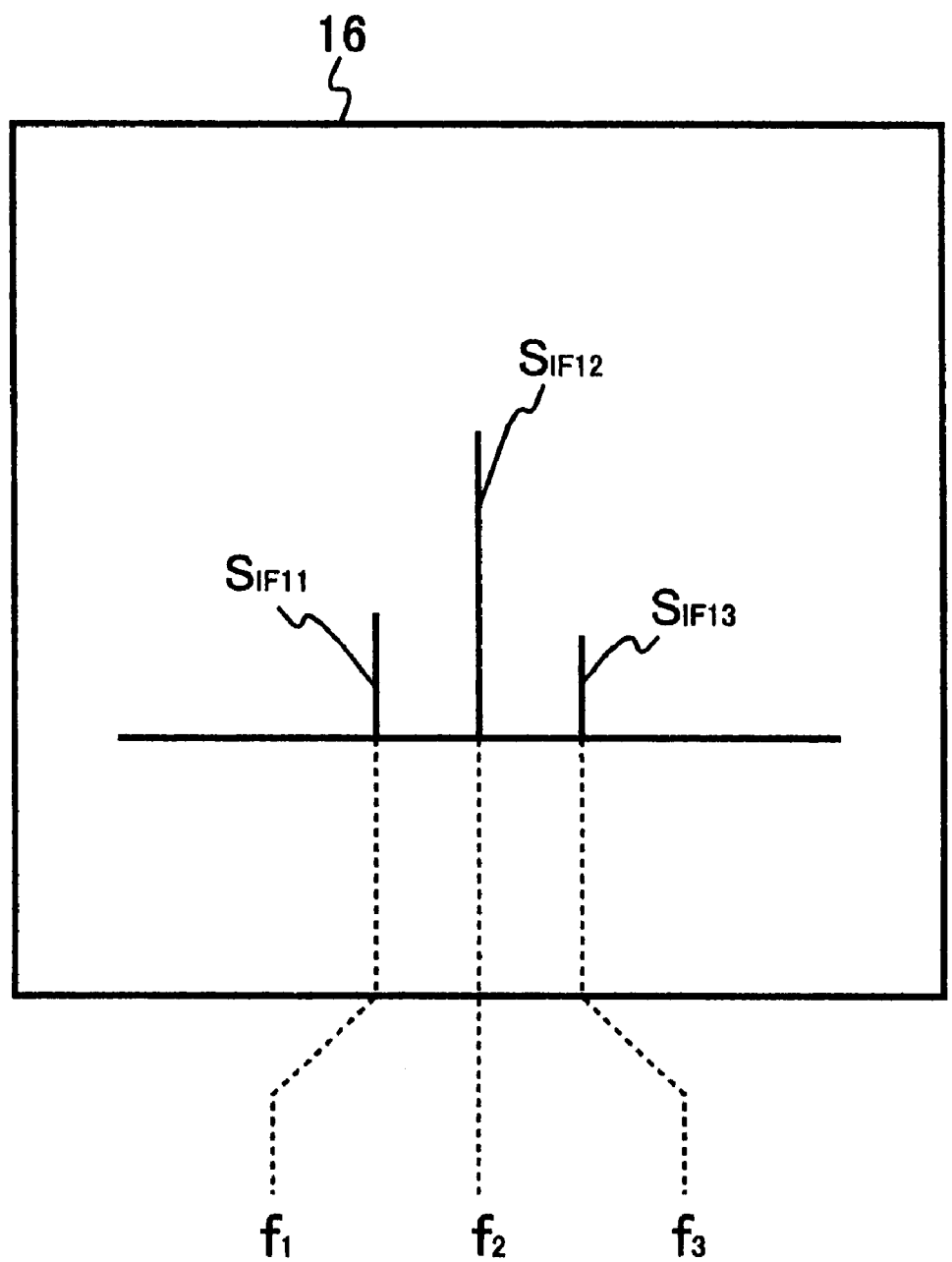
FIG. 15 is a front view of a display device showing a display example for explaining an operation of the sweep type spectrum analyzer shown in FIG. 14.
Figure 16:
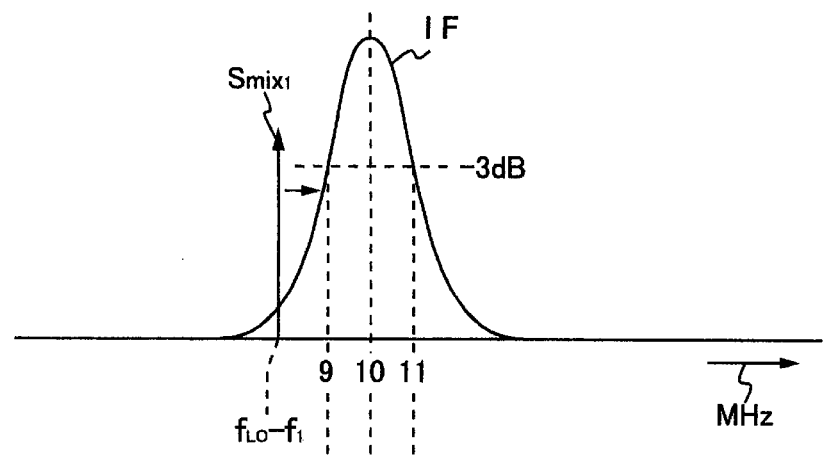
FIGS. 16A–16E are waveform diagrams for explaining an operation of the sweep type spectrum analyzer shown in FIG. 13.
Figure 16:
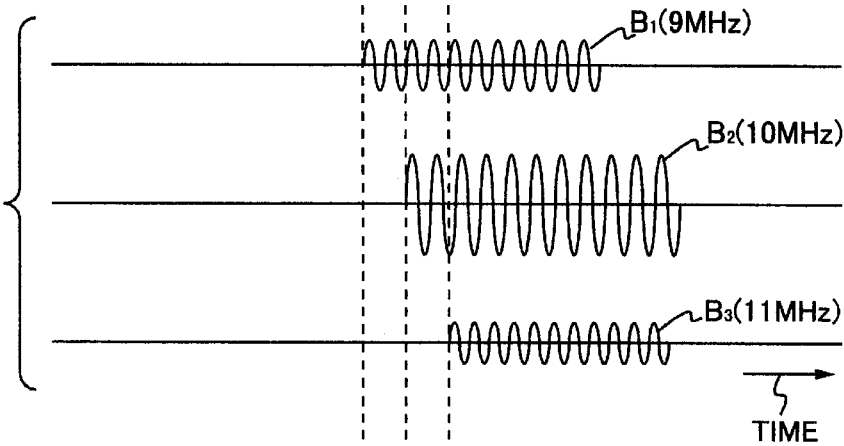
Figure 16:
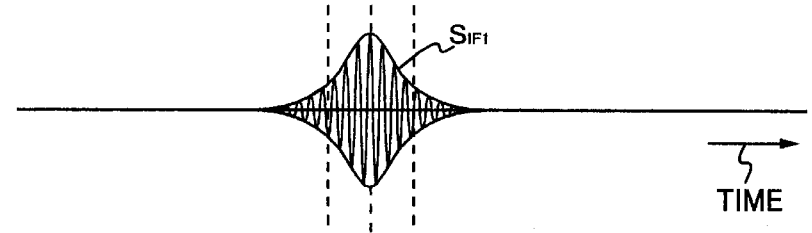
Figure 16:
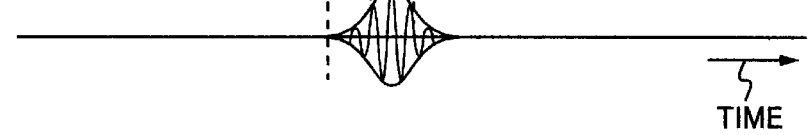
Figure 16:
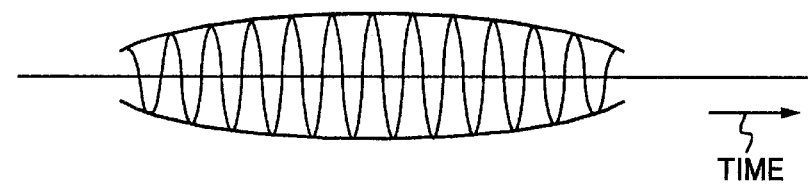
Figure 17:
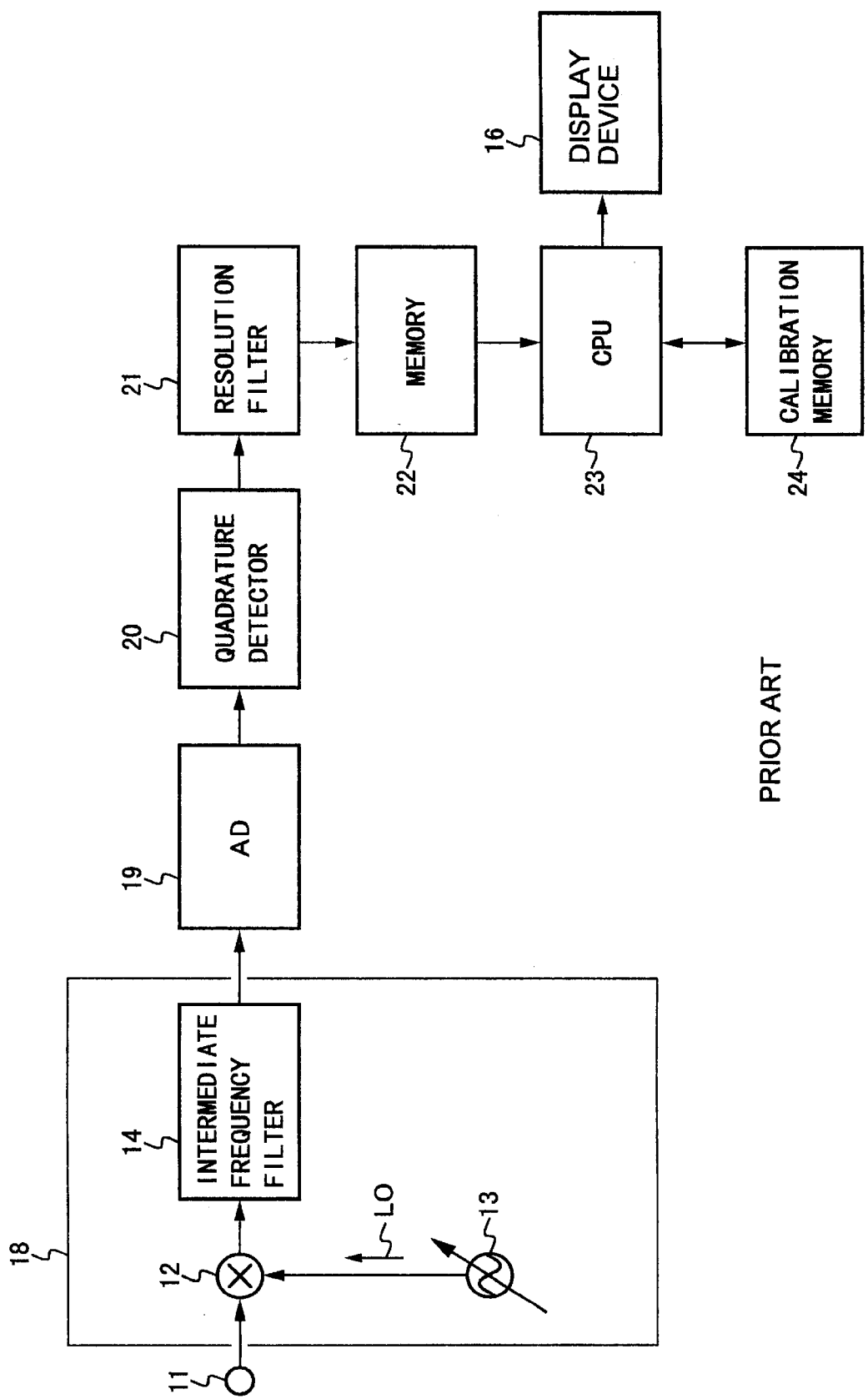
FIG. 17 is a block diagram showing a basic circuit configuration of further another example of the conventional sweep type spectrum analyzer.

FIG. 1 shows a simplest circuit configuration of a sweep type spectrum analyzer to which a frequency analysis method according to the present invention can be applied. Further, portions or elements in FIG. 1 corresponding to those in FIGS. 13, 14 and 17 will be shown by the same reference characters or numbers affixed thereto and the explanation thereof will be omitted unless it is necessary.

In the first embodiment of the present invention, there is provided a frequency analysis method comprising the steps of: multiplying an intermediate frequency signal $S_{IF}$ by an inverse swept signal XLO, the intermediate frequency signal $S_{IF}$ being extracted by frequency-discriminating in the direction of time base (time axis) in a time-to-frequency converting apparatus 18 and the inverse swept signal XLO being frequency-swept in the reverse direction to the frequency transition direction of this intermediate frequency signal $S_{IF}$; and extracting a constant frequency component obtained from the results of the multiplications as a frequency spectrum included in a signal to be measured (a signal under measurement) $S_{in}$.

In order to implement such frequency analysis method, an inverse chirp correction device 25 is provided at an output side of the time-to-frequency converting apparatus 18, as shown in FIG. 1. This inverse chirp correction device 25 can be constituted by a multiplier (mixer) 25A and a sub or secondary local oscillator 25B. The secondary local oscillator 25B generates an inverse swept signal XLO the frequency swept direction of which is opposite to the frequency swept direction of a main swept frequency signal LO of the main local oscillator 13. This inverse swept signal XLO is multiplied by the intermediate frequency signal $S_{IF}$ in the multiplier 25A.

As stated earlier, the intermediate frequency signal $S_{IF}$ outputted from the time-to-frequency converting apparatus 18 is outputted every time a difference frequency between each of frequencies $f_1$, $f_2$ and $f_3$ of respective signal components $S_1$, $S_2$ and $S_3$ included in the signal to be measured $S_{in}$ and the frequency of the main swept frequency signal LO (the explanation will be given in this example using the difference frequency therebetween, but the sum frequency therebetween may also be used) falls into the frequency passband of the intermediate frequency filter 14, and is an intermediate frequency signal $S_{IF}$ which makes a frequency transition in a constant frequency bandwidth.

In the present invention, the frequency swept direction of the inverse swept signal XLO is set to the reverse direction to the frequency swept direction of the intermediate frequency signal $S_{IF}$, and at the same time the frequency sweeping span (band) of the inverse swept signal is set to a bandwidth equal to or narrower than the passband width of the intermediate frequency filter 14.

Figure 2:
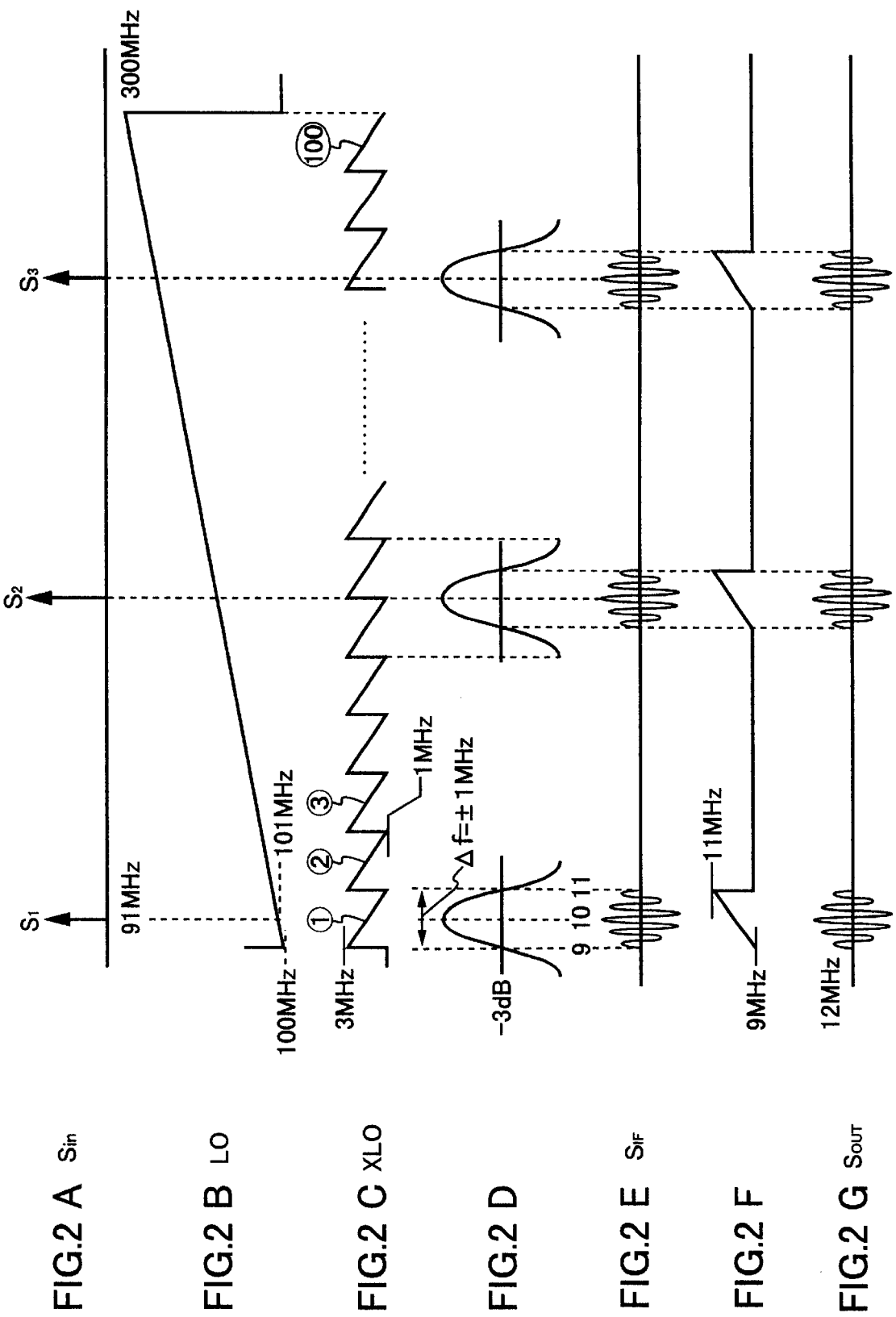
FIGS. 2A–2G are waveform diagrams for explaining an inverse chirp correction operation which can be used in the frequency analysis method according to the present invention.

The frequency analysis method according to the present invention will be described in detail with reference to FIG. 2. FIG. 2A shows the signal components $S_1$, $S_2$ and $S_3$ included in the signal to be measured $S_{in}$ supplied to the input terminal 11. FIG. 2B shows a main swept frequency signal LO generated from the main local oscillator 13 when a sawtooth wave signal $S_w$ generated from a main sawtooth wave generator 15 is applied to the main local oscillator 13. In the illustrated example, the main local oscillator 13 generates the main swept frequency signal LO sweeping in frequency over a frequency range from 100 MHz to 300 MHz, based on the sawtooth wave signal $S_w$. FIG. 2C shows a frequency-sweep state of the inverse swept signal XLO which is generated from the secondary local oscillator 25B and is inputted to the multiplier 25A. The illustrated example shows a case in which the passband width Δf of the intermediate frequency filter 14 shown in FIG. 2D is 2 MHz (±1 MHz). In the case that the passband width Δf of the intermediate frequency filter 14 is 2 MHz, the frequency-sweeping span of the inverse swept signal XLO is also selected to be 2 MHz, i.e., 3 MHz to 1 MHz, and further the main sweep rate of the main swept frequency signal (main frequency sweep rate) and the inverse sweep rate of the inverse swept signal (inverse sweep rate) are set to the same rate. By such settings, the time interval required for the main swept frequency signal LO to make one sweep and the time interval required for the inverse swept signal XLO to make 100 sweeps are caused to be identical, Here, it is assumed that a frequency of a signal component $S_1$ included in a signal to be measured $S_{in}$ is 91 MHz. When the frequency of the main swept frequency signal LO frequency-sweeps over a frequency range of 100–102 MHz, the frequency of the intermediate frequency signal $S_{IF}$ makes a frequency transitions from 9 MHz through 11 MHz. As a result, this signal passes through the intermediate frequency filter 14 and is inputted to one input terminal of the multiplier 25A.

Figure 3:
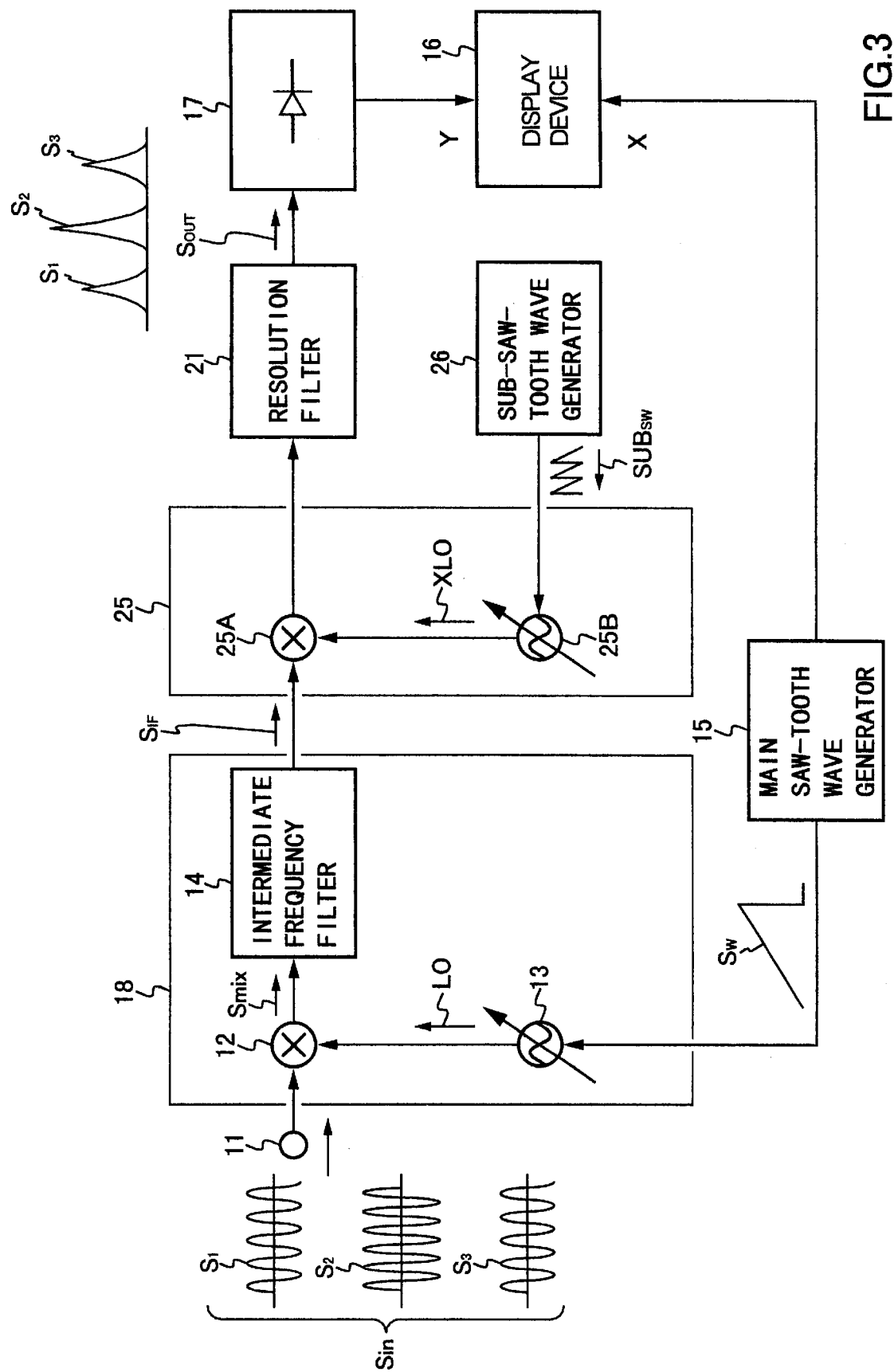
FIG. 3 is a block diagram showing a first variation example in which a detector is added to the basic circuit configuration of the sweep type spectrum analyzer shown in FIG. 1.

When the secondary local oscillator 25B begins a frequency sweep operation that is interlocked with a frequency sweep operation of the main local oscillator 13, the frequency of the inverse swept signal XLO becomes, as shown in FIG. 2C, 3 MHz if the frequency of the intermediate frequency signal $S_{IF}$ is 9 MHz (refer to FIG. 2F). Therefore, the sum of the both frequencies is 12 MHz.

If the frequency of the intermediate frequency signal $S_{IF}$ (refer to FIG. 2E) is 10 MHz, the frequency of the inverse swept signal XLO becomes 2 MHZ. Therefore, the sum of the both frequencies is 12 MHz.

If the frequency of the intermediate frequency signal $S_{IF}$ is 11 MHz, the frequency of the inverse swept signal XLO becomes 1 MHz. Therefore, the sum of the both frequencies is 12 MHz.

In this manner, when the frequency transition of the intermediate frequency signal $S_{IF}$ is multiplied by the inverse swept frequency signal XLO to obtain a summed frequency component of the both signals, a signal component $S_{OUT}$ having a constant frequency (FIG. 2G) can be extracted. Therefore, when the center frequency of the passband of the resolution filter 21 is set, in this example, to 12 MHz, the constant frequency signal component $S_{OUT}$ having a summed frequency of two signals can be obtained. In the example shown in FIG. 1, the envelope $A_1$ of the constant frequency signal component $S_{OUT}$ is displayed by the display device 16 as a frequency spectrum of the signal component $S_1$.

As is apparent from the above description, it is sufficient for the resolution filter 21 to extract the constant frequency signal component $S_{OUT}$. Therefore, even if the passband of the resolution filter 21 is set to sufficiently narrow band, a quick response is possible. As a result, even if the sweep rate of the main frequency sweep is increased, the resolution filter 21 only extracts the constant frequency signal component. Therefore, the resolution filter 21 can sufficiently respond.

Further, in the above description, a case in which the frequency of a signal component $S_1$ included in a signal to be measured is disposed exactly at the center of the sweep span of an inverse swept signal XLO is shown. However, even in the case in which the frequency of a signal like the signal components $S_2$ and $S_3$ shown in FIG. 2 is not set to the center of the sweep span of the inverse swept signal XLO, and hence the frequency range spans over two inverse swept signals XLO, the same operation as in the aforementioned case can be performed.

In the configuration shown in FIG. 1, the output of the resolution filter 21 is directly supplied to the vertical input terminal Y of the display device 16. However, if, as shown in FIG. 3, the detector 17 is provided at the output side of the resolution filter 21 to detect the output of the resolution filter 21, as illustrated, the detected single polar envelopes are displayed as the frequency spectrums $S_1$, $S_2$ and $S_3$ by the display device 16. In addition, if as shown in FIG. 4, a logarithmic amplifier Log is further inserted at the front stage of the detector 17, the spectrum intensity displayed by the display 16 can be expressed in logarithmic expression.

Figure 4:
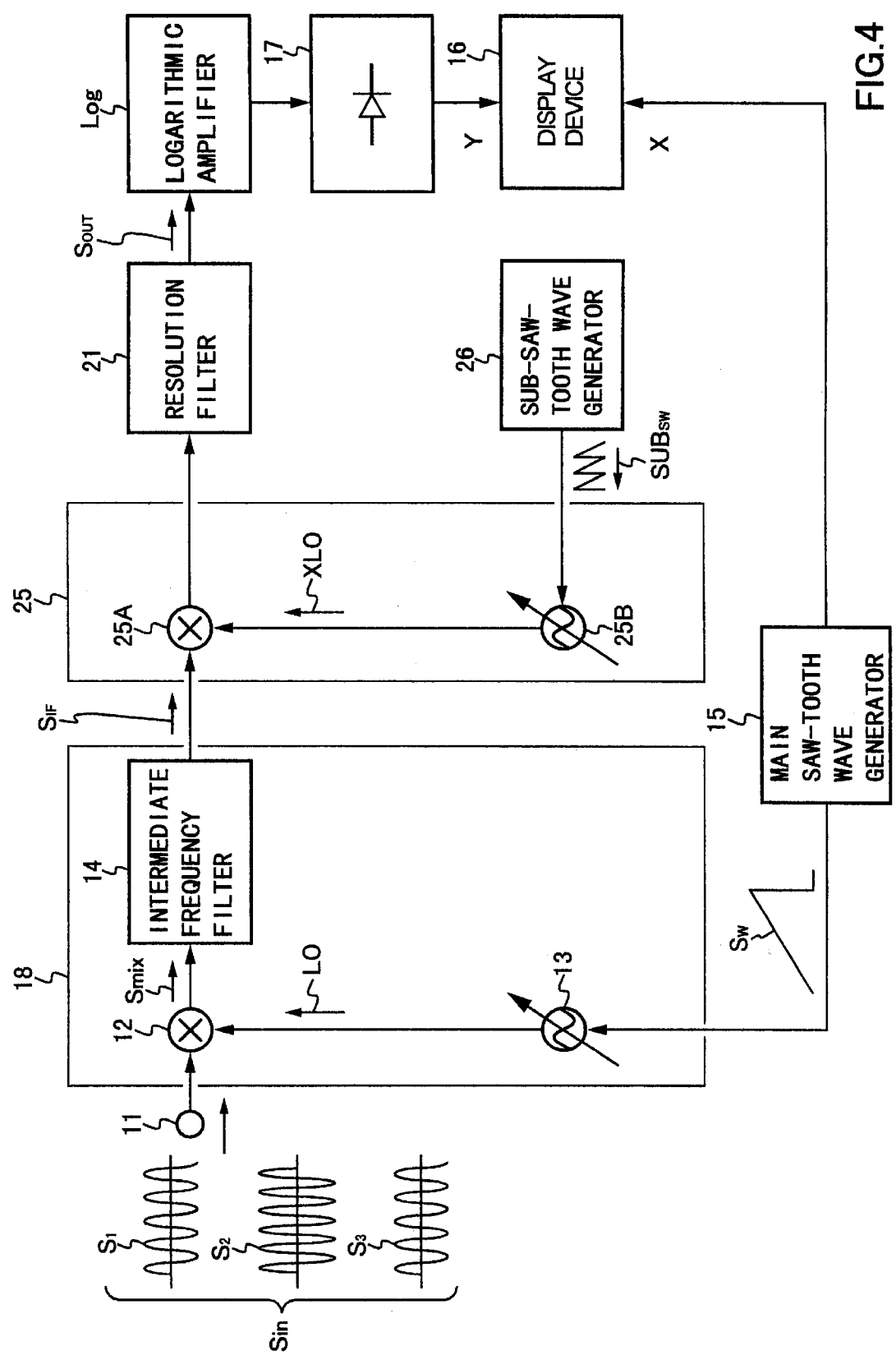
FIG. 4 is a block diagram showing a second variation example in which a logarithmic amplifier is further added to the basic circuit configuration of the sweep type spectrum analyzer shown in FIG. 3.

Incidentally, each of the configurations of the apparatus exemplarily shown FIGS. 1, 3 and 4 is a simplest basic configuration shown for making a very fundamental explanation. Practically, various components are added to those basic configurations. That is, in the basic configuration shown in FIG. 1, the explanation is made assuming that the entire passband of the intermediate frequency filter 14 is inversely frequency-swept by one sweep operation of the inverse swept signal XLO and one frequency spectrum is depicted by one inverse chirp correction operation. However, practically, the passband width of the intermediate frequency filter 14 is divisionally corrected a plurality of times by the inverse chirp correction, and a sample-hold operation is performed for the extraction result of each inverse chirp correction. Then a plurality of the sample-hold results are connected to depict a frequency spectrum.

Figure 5:
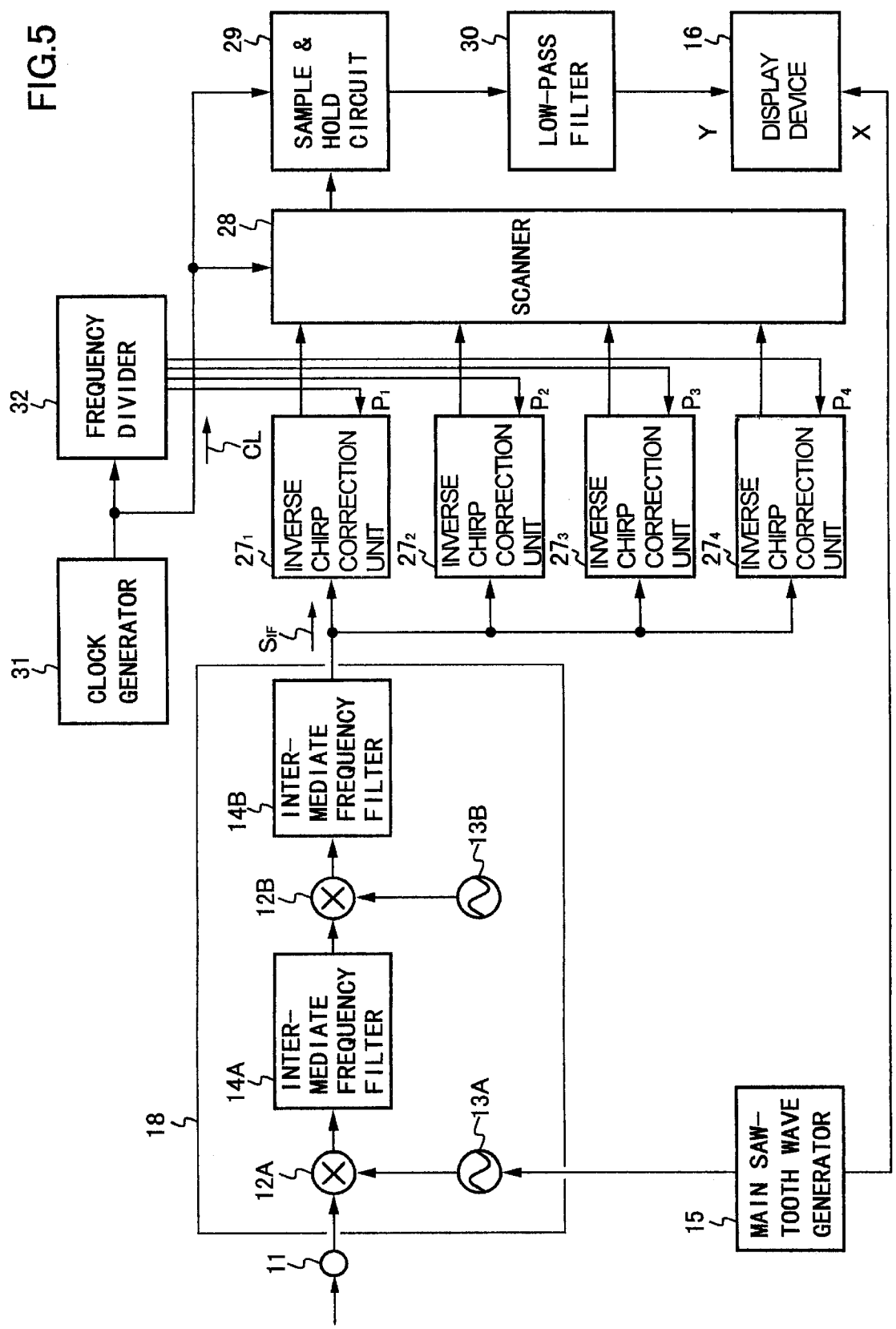
FIG. 5 is a block diagram showing a first embodiment of the sweep type spectrum analyzer using the frequency analysis method according to the present invention.

FIG. 5 is a block diagram showing a first embodiment of the sweep type spectrum analyzer according to the present invention. In the first embodiment of the present invention shown in FIG. 5, there is shown an example of the spectrum analyzer constructed such that four inverse chirp correction units $27_1$–$27_4$ are connected in parallel to the output side of the time-to-frequency converting apparatus 18, an intermediate frequency signal $S_{IF}$ is corrected by the inverse chirp correction by each of the four inverse chirp correction units $27_1$–$27_4$ with a slight time difference between the correction operations, a sample-hold operation is performed for the detected output value having constant frequency components extracted by each of the inverse chirp correction operations. Each of the sample-hold operation results is obtained by a scanner 28 in the sequential order, those sample-hold values are acquired in a common sample-and-hold circuit 29 in the sequential order, voltage signals acquired in the sample-and-hold circuit 29 are inputted to a low-pass filter 30, those voltage signals are passed through the low-pass filter 30 to obtain a continuous voltage signal, and this continuous voltage signal is inputted to the Y input terminal of the display device 16.

Figure 6:
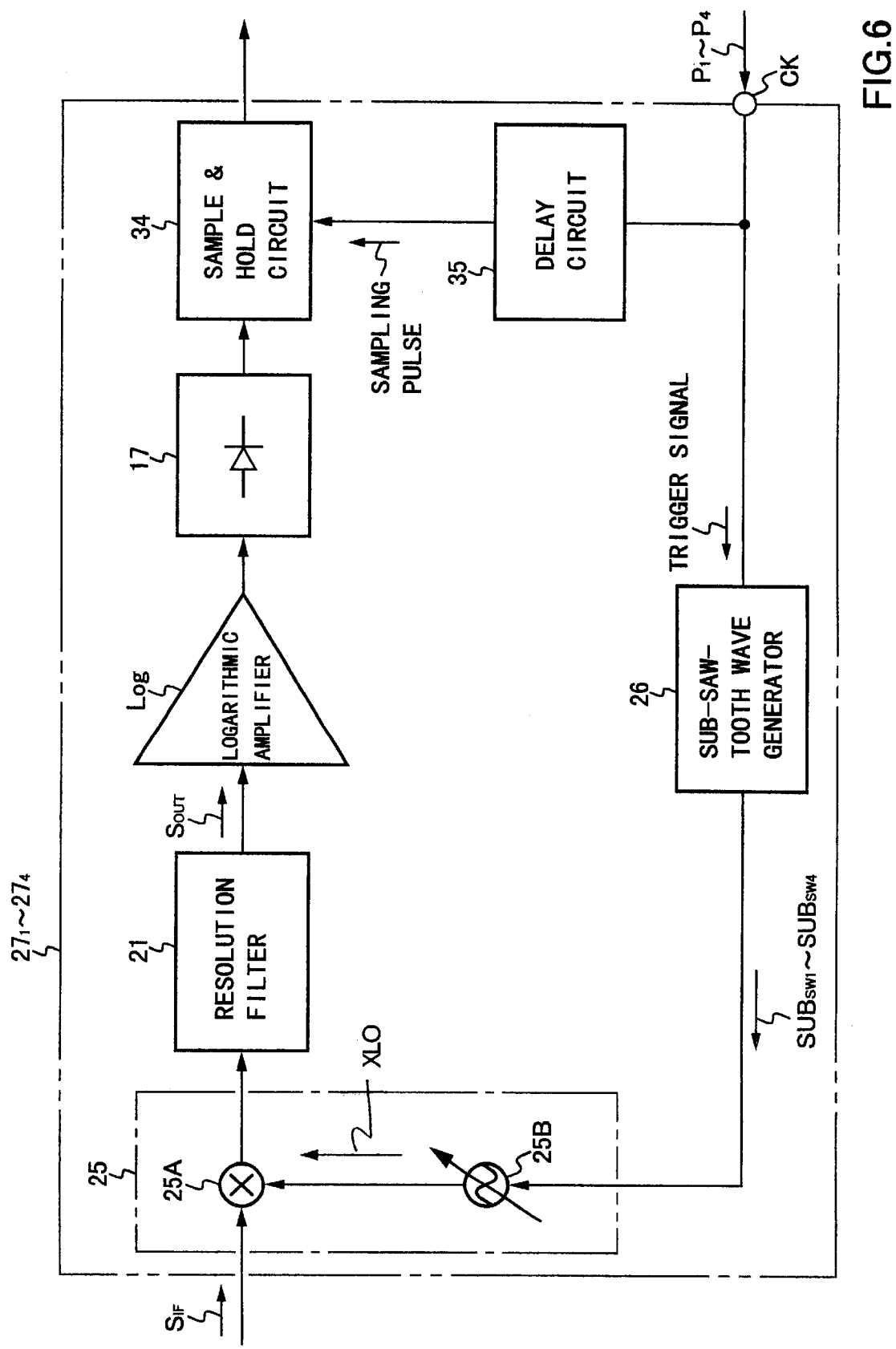
FIG. 6 is a block diagram showing in detail the inside of an inverse chirp correction unit used in the sweep type spectrum analyzer shown in FIG. 5.

FIG. 6 shows the configuration of one of the inverse chirp correction units $27_1$–$27_4$ used in the first embodiment constructed as mentioned above. Since each of the four inverse chirp correction units $27_1$–$27_4$ has the same circuit configuration, FIG. 6 shows only one circuit configuration of the inverse chirp correction unit.

The example shown in FIG. 6 is a case in which a logarithmic amplifier Log is disposed between the resolution filter 21 and the detector 17, a sample-and-hold circuit 34 is disposed at the output side of the detector 17, and a sample-hold value of the sample-and-hold circuit 34 is defined as an output value of each of the inverse chirp correction units $27_1$–$27_4$. Further, a delay circuit 35 inserted in the clock supply path for supplying sampling pulses to the sample-and-hold circuit 34 from a clock input terminal CK of each inverse chirp correction unit is a delay circuit having a delay time corresponding to a time length from a time point (timing) when a trigger signal is supplied to the secondary sawtooth wave generator 26 from the clock input terminal CK to a time point when the secondary sawtooth wave generator 26 finishes a secondary sweep operation. Therefore, a sampling pulse is supplied to the sample-and-hold circuit 34 at the end timing of the inverse chirp correction in each of the inverse chirp correction units $27_1$–$27_4$, and the detection output charged by the end timing of the inverse chirp correction is held by the sample-and-hold circuit 34.

Figure 7A:
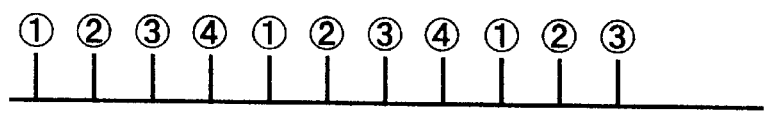
FIGS. 7A–7C are waveform diagrams for explaining an operation of the spectrum analyzer shown in FIG. 5.
Figure 7B:
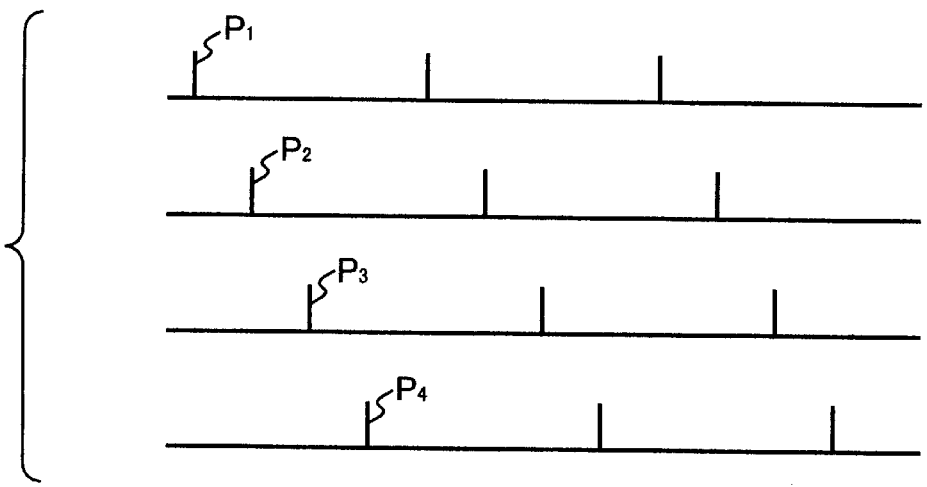

A clock to be supplied to each clock input terminal CK of the inverse chirp correction units $27_1$–$27_4$ is supplied from a frequency divider 32 shown in FIG. 5. The frequency divider 32 is, in this example, a ¼ frequency divider for dividing a clock CL (FIG. 7A) outputted from a clock generator 31 into a clock having a ¼ frequency, and outputs, as shown in FIG. 7B, four phase clocks $P_1$–$P_4$. Those clocks $P_1$–$P_4$ are inputted to the clock input terminals CK of the corresponding inverse chirp correction units $27_1$–$27_4$, respectively. Specifically, the clock $P_1$ is inputted to the corresponding inverse chirp correction unit $27_1$. The next clock $P_2$ is inputted to the corresponding inverse chirp correction unit $27_2$. The next clock $P_3$ is inputted to the corresponding inverse chirp correction unit $27_3$. The next clock $P_4$ is inputted to the corresponding inverse chirp correction unit $27_4$.

Figure 7C:
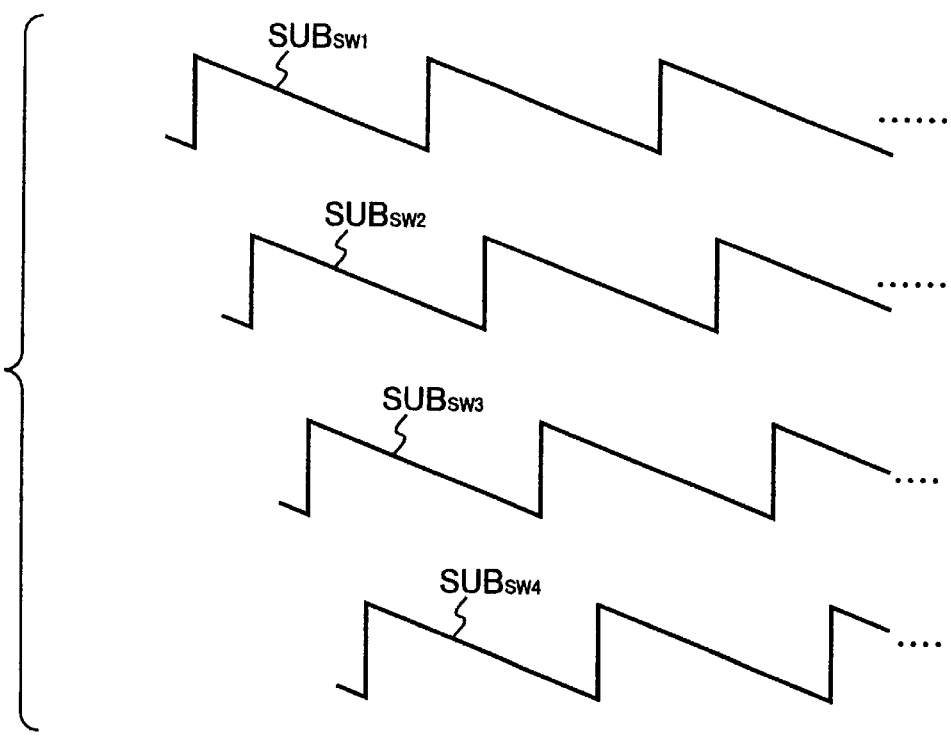

At each supply timing of each of the clocks $P_1$–$P_4$, a sub or secondary sawtooth wave generator 26 of the corresponding inverse chirp correction unit is triggered, and four phase inverse sawtooth waves (a sawtooth wave whose amplitude is gradually decreased) $SUB_{SW1}$–$SUB_{SW2}$ shown in FIG. 7C are generated. Those inverse sawtooth waves $SUB_{SW1}$–$SUB_{SW2}$ are supplied to secondary local oscillators 25B of corresponding inverse chirp correction device 25. Each of the secondary local oscillators 25B generates an inverse swept signal XLO and supplies the inverse swept signal XLO to a mixer 25A. By such an operation, an inverse chirp correction operation is performed in each of the inverse chirp correction units $27_1$–$27_4$. Then at each end timing of the inverse chirp correction operation, a detection output of the detector 17 is held by the sample-and-hold circuit 34.

In such a way, sample voltages which were sampled and held in each of the inverse chirp correction units $27_1$–$27_4$ are extracted by the scanner 28 in the sequential order at the period of clock CL outputted from the clock generator 31, and the extracted sample-hold voltages are supplied to the sample-and-hold circuit 29. Further, by extracting the sample-hold voltages from the sample-and-hold circuit 29 via a low-pass filter 30, as a continuous voltage signal can be obtained from those voltages. Thus, a voltage signal representing a spectrum can be obtained.

The inverse frequency sweep bandwidth of the inverse chirp correction operation in this case is set to the bandwidth equal to or slightly narrower than that of the intermediate frequency signal $S_{IF}$ outputted by the time-to-frequency converting apparatus 18. In short, during the inverse chip correction operation in each of the inverse chirp correction units $27_1$–$27_4$, even if the frequency of the intermediate frequency signal $S_{IF}$ is disposed at any frequency position in the passband width of the intermediate frequency filter 14B, it is sufficient that each of the inverse chirp correction units $27_1$–$27_4$ satisfies the condition for acquiring the intermediate frequency signal without any exception. Further, it is needless to say that the number of the inverse chirp correction units $27_1$–$27_4$ is not limited to four but any number greater than or equal to two can be selected. In addition, it is sufficient that the frequency of the clock CL is selected to be a frequency by which the main frequency sweep time can be divided into, for example, 100 or more equal time periods.

Further, in the time-to-frequency converting apparatus 18 shown in FIG. 5, a circuit configuration in which a fixed local oscillator 13B is provided is shown. However, this fixed local oscillator 13B is provided for the only purpose to shift the frequency of the intermediate frequency signal $S_{IF}$ outputted from the time-to-frequency converting apparatus 18 to eliminate an image signal by the oscillation frequency of the fixed local oscillator 13B to upper side or lower side. Therefore, the illustrated configuration shows only a simple example of shifting the frequency of the intermediate frequency signal $S_{IF}$, and hence the configuration is not related to the essential points of the invention.

Figure 8:
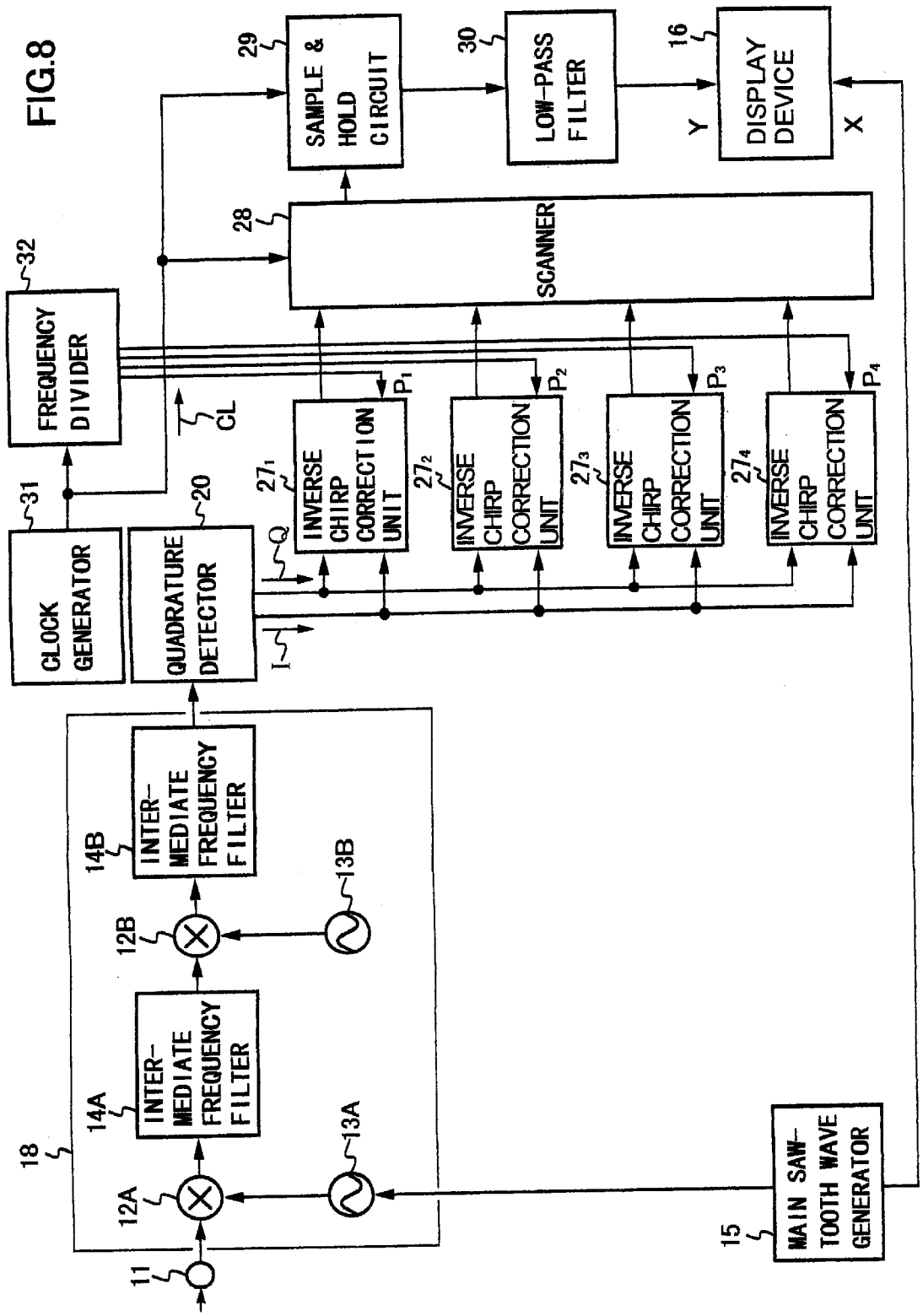
FIG. 8 is a block diagram showing a second embodiment of the sweep type spectrum analyzer using the frequency analysis method according to the present invention.

FIG. 8 is a block diagram showing a second embodiment of the spectrum analyzer using the frequency analysis method according to the present invention. In this second embodiment, a quadrature detector 20 is provided at rear stage of the time-to-frequency converting apparatus 18, the intermediate frequency signal $S_{IF}$ outputted from the time-to-frequency converting apparatus 18 is quadrature-detected by the quadrature detector to obtain a complex signal consisting of a real part I and an imaginary part Q, and the signal components of the real part I and the imaginary part Q of this complex signal are inputted to a plurality of (in this example, four) inverse chirp correction units $27_1$–$27_4$ connected in parallel. In each of the inverse chirp correction units $27_1$–$27_4$, an inverse chirp correction is applied to each of the real part I and the imaginary part Q. After the inverse chirp correction, $I^2+Q^2$ is obtained to calculate the power, then those power values are extracted by the scanner 28 in the sequential order by shifting the scanning time slightly from each other to supply those power values to the common sample-and-hold circuit 29, and further those power values are converted to a continuous signal and inputted to the vertical input terminal Y of the display device 16 to display the frequency spectrum of the signal to be measured $S_{in}$.

Figure 9:
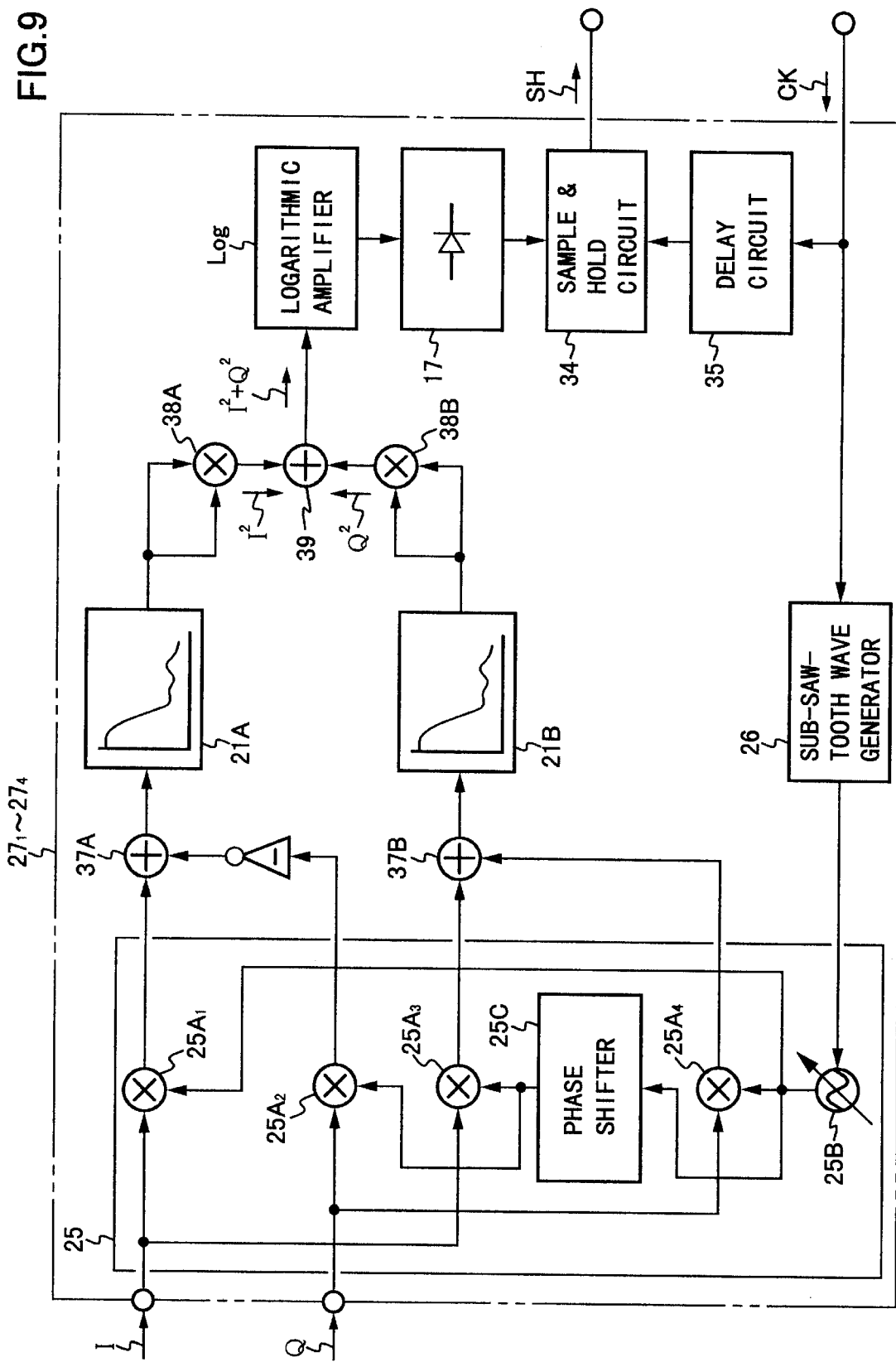
FIG. 9 is a block diagram showing in detail the inside of an inverse chirp correction unit used in the sweep type spectrum analyzer shown in FIG. 8.

FIG. 9 shows a configuration of one of the inverse chirp correction units $27_1$–$27_4$ used in the second embodiment described above. Since each of the four inverse chirp correction units $27_1$–$27_4$ has the same circuit configuration, FIG. 9 shows only one circuit configuration of the inverse chirp correction unit.

The inverse chirp correction device 25 comprises four multipliers (mixers) $25A_1$–$25A_4$, a secondary local oscillator 25B, a π/4 phase shifter 25C, and applies an inverse chirp correction to each of the real part I and the imaginary part Q of the inputted complex signal. The real part I is supplied to the multipliers $25A_1$ and $25A_3$, and the imaginary part Q is supplied to the multipliers $25A_2$ and $25A_4$. In addition, the inverse swept signal of the secondary local oscillator 25B is directly supplied to the multipliers $25A_1$ and $25A_4$, and is supplied to the multipliers $25A_2$ and $25A_3$ via the π/4 phase shifter 25C. In the portion of the adder 37A, an inverse chirp correction result signal of the imaginary part Q is subtracted from an inverse chirp correction result signal of the real part I, and a process for adjusting, by this subtraction operation, the component of the real part I to a stable base band signal (signal containing direct current component) is performed. The adder 37B performs a process for adjusting the component of the imaginary part Q to a stable base band signal.

That is, the components of the real part I and the imaginary part Q quadrature-detected and outputted by the quadrature detector 20 naturally have a characteristic for being base band signals. However, it is in the difficult situation to obtain a stable base band signal due to, for example, an occurrence of beat or the like during the inverse chirp correction process. For this reason, in this second embodiment, the spectrum analyzer is constructed such that an inverse chirp correction result signal of the imaginary part Q is subtracted from an inverse chirp correction result signal of the real part I, and as a result, a stable inverse chirp signal of the real part I is obtained. With respect to the imaginary part Q, an adder 37B is provided for the same reason. In the adder 37B, an inverse chirp correction result signal of the imaginary part Q and an inverse chirp correction result signal of the real part I are summed to obtain a stable base band signal.

Therefore, a low-pass filter is used as each of the resolution filters 21A and 21B. The base band signals are obtained from those resolution filters 21A and 21B. Each of the multipliers 38A and 38B makes up a squaring circuit. A square of the real part, i.e., $I^2$ and a square of the imaginary part Q, i.e., $Q^2$ are obtained by the squaring circuits 38A and 38B, respectively. Then those square values are summed by the adder 39 to obtain the power $I^2+Q^2$.

The power $I^2+Q^2$ obtained by the adder 39 is inputted to the logarithmic amplifier Log to be logarithmically amplified. The logarithmically amplified power is detected by the detector 17 and the detection output is sampled and held by the sample-and-hold circuit 34. The sample-hold output SH from the sample-and-hold circuit 34 is acquired by the scanner 28. In this second embodiment, the spectrum analyzer is also constructed such that a sampling pulse to be supplied to the sample-and-hold circuit 34 is delayed by the delay circuit 35 by a time length corresponding to the inverse chirp correction operation time, and the sampling operation is performed at the time point close to the end time of the inverse chirp correction operation.

As in the second embodiment, when the spectrum analyzer is constructed such that an intermediate frequency signal $S_{IF}$ is quadrature-detected, the complex data I and Q obtained by the quadrature detection are separately corrected by the inverse chirp correction process, and the power $I^2+Q^2$ is calculated, there is obtained an advantage that a spectrum having an accurate power ratio can be obtained.

In other words, in the examples shown in FIGS. 1, 3, 4 and 5, only a real part is, exactly speaking, handled, and hence it cannot be said that an accurate power ratio of a spectrum is displayed. Therefore, if an accurate display of a spectrum is required, the spectrum analyzer of the second embodiment shown in FIG. 8 is used.

Each of the embodiments described above is an example of the spectrum analyzer constructed by analog circuits. In reality, when easiness or the like of the inverse chirp correction is considered, a simpler circuit configuration can be obtained by constructing the rear stage portion after the time-to-frequency converting apparatus 18 by digital circuits.

Figure 10:
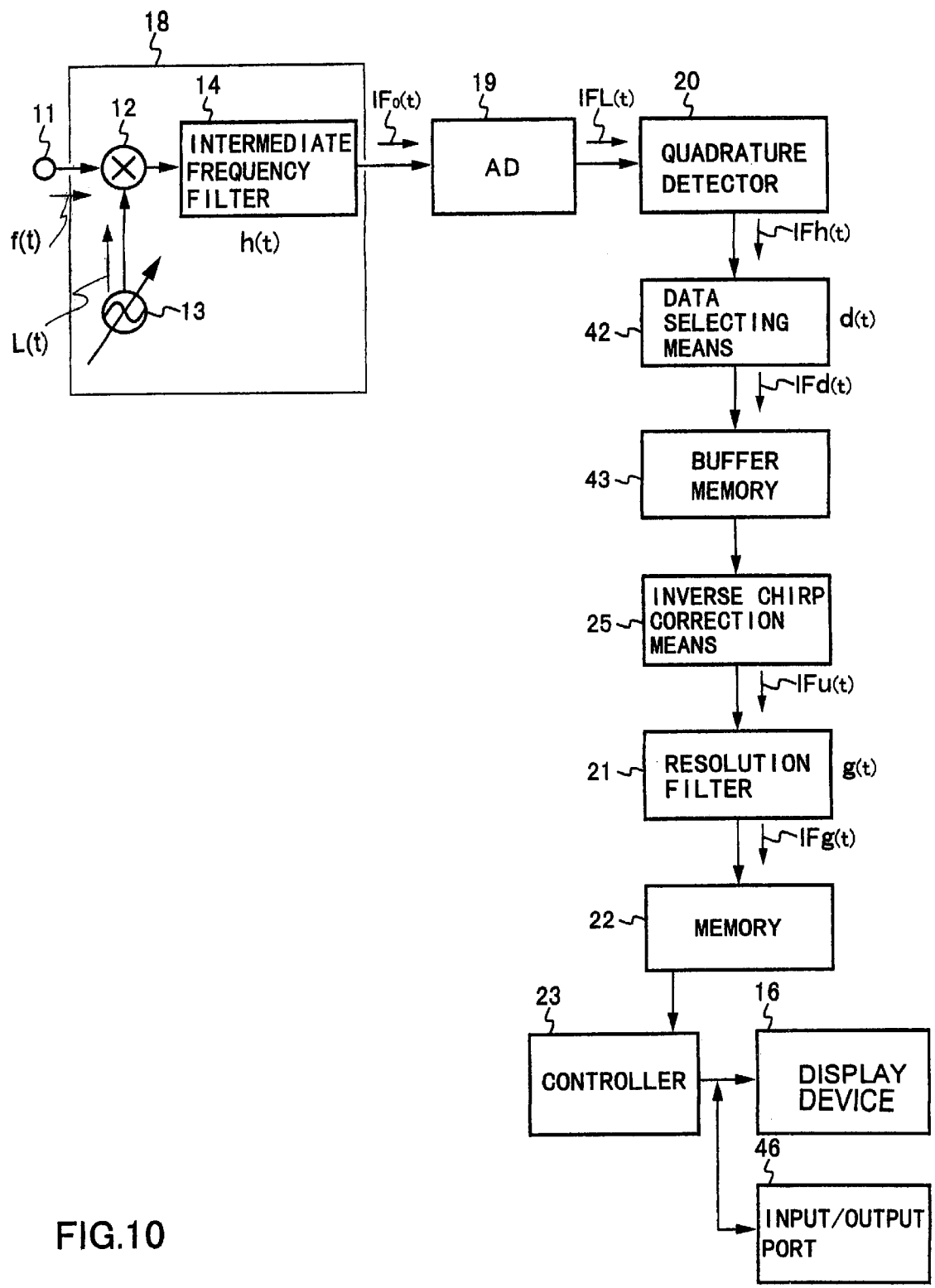
FIG. 10 is a block diagram showing a third embodiment of the sweep type spectrum analyzer using the frequency analysis method according to the present invention.
Figure 11:
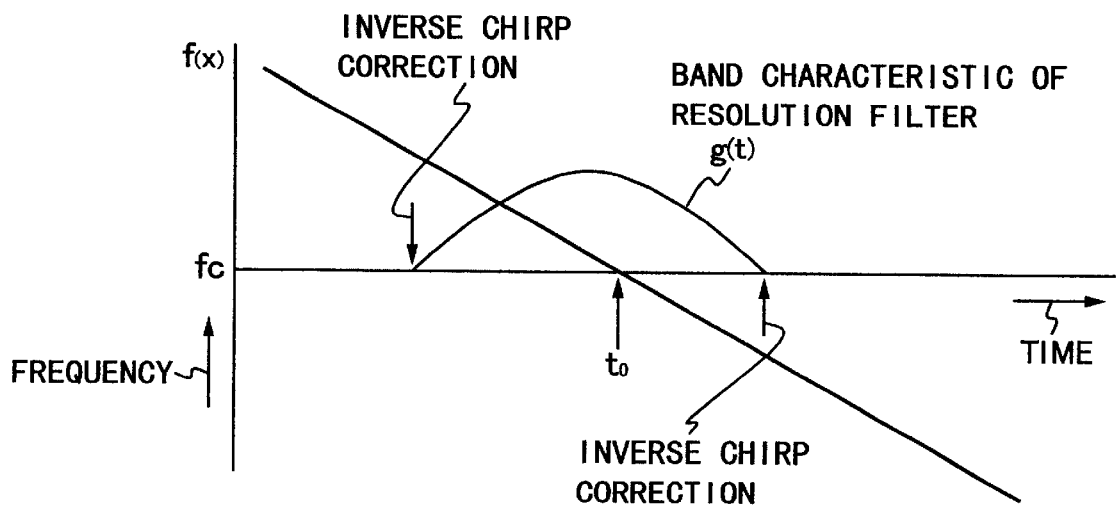
FIG. 11 is a characteristic diagram for explaining an operation of the sweep type spectrum analyzer shown in FIG. 10.
Figure 12:
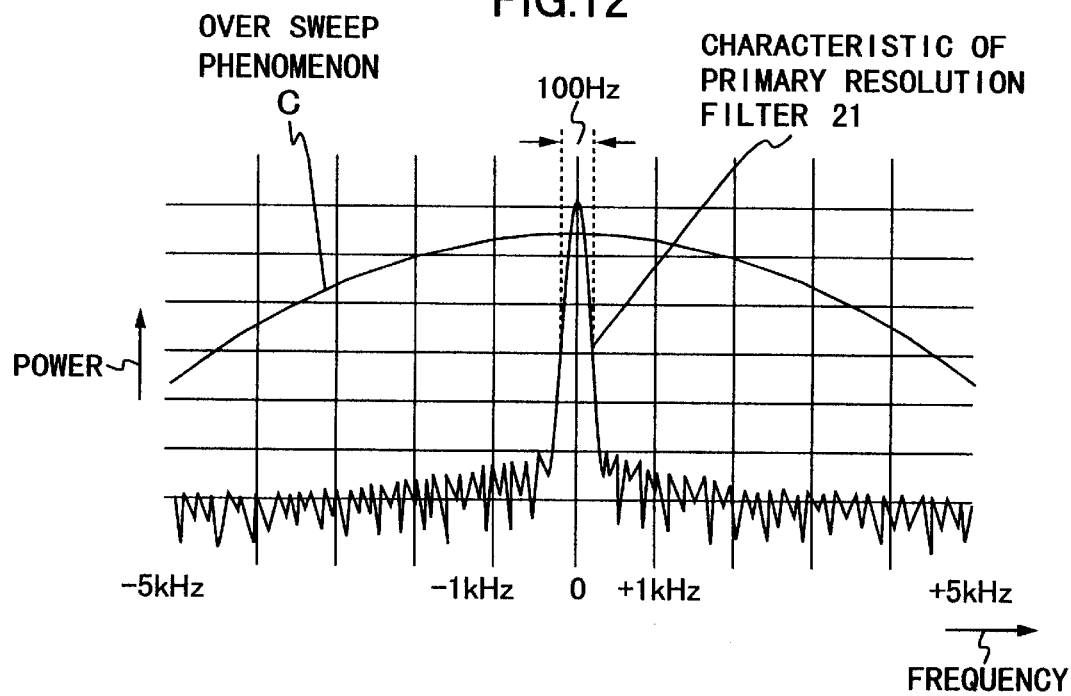
FIG. 12 is a characteristic diagram for explaining an operation of the sweep type spectrum analyzer shown in FIG. 10.

FIG. 10 shows a third embodiment of the sweep type spectrum analyzer according to the present invention wherein the rear stage portion after the time-to-frequency converting apparatus 18 is comprised of digital circuits. In the third embodiment, an AD (analog-digital) converter 19 is provided at the rear side of the time-to-frequency converting apparatus 18. The intermediate frequency signal $S_{IF}$ outputted from the time-to-frequency converting apparatus 18 is converted into a digital signal, and this digital conversion output is quadrature-detected by the quadrature detector 20 to obtain the already explained complex signals I and Q.

The complex signals I and Q obtained by the quadrature detector 20 are supplied to, for example, a data selecting apparatus 42 referred to as a decimation filter or the like to remove the high-pass components by the low-pass characteristic of the data selecting apparatus 42. By this process, the data volume is reduced and the memory capacity and the calculation load required in the next stage and after are reduced.

The complex signals whose data volume is limited by the data selecting apparatus 42 are temporarily stored in the buffer memory 43. Then those complex signals are inputted to the inverse chirp correction device 25, where frequency transitions are offset. Thus, the complex signals are fixed to have a constant frequency.

The inverse chirp correction device 25 can perform a calculation process utilizing the complex signals stored in the buffer memory 43. With respect to this point, it is not necessary to provide, as in the analog circuit, many inverse chirp correction units $27_1-27_4$. This is the reason why the circuit is simplified by a digital circuit arrangement.

The complex signals obtained from the inverse chirp correction process are frequency-restricted by the resolution filter 21, and further their square sum is calculated. As a result, the square sum output is stored in the memory 22 as a spectrum component.

The spectrum components stored in the memory 22 are read out therefrom by a controller 23 comprised of a computer system and are supplied to the display device 16 to be displayed. In addition, the spectrum components are transferred, if necessary, to external devices via an input/output port 46.

If each of the inverse chirp correction device 25 and the resolution filter 21 is constructed by digital circuits, arithmetic and logic circuits can be used. Therefore, the inverse chirp correction operation and the frequency restriction operation of the resolution filter can be performed through arithmetic and logic processes.

Hereinafter, the arithmetic process steps of the digital circuits and the fact that a high rate sweep operation is actually possible are made clear using equations.

First, the signal flows in the spectrum analyzer will be expressed by equations.

A local oscillation signal L(t) outputted by the main local oscillator 13 is expressed by equation (1) assuming;

SPAN=SP: frequency sweeping span or bandwidth
Sweep Time=Ts; sweep time
a: local oscillation frequency at time point t=0
σ=SP/2Ts
t=−Ts/2 to Ts/2
$\theta_o$: initial phase $$L(t)=\exp[-j(\sigma t^2+a\,t+\theta_0)] \quad (1)$$

When a base band signal is supplied, without applying the inverse chirp correction process thereto, to the resolution filter 21, if the frequency bands of an impulse response h(t) of the intermediate frequency filter 14 and an impulse response d(t) of the data selecting apparatus 42 are sufficiently wide compared with the frequency band of an impulse response g(t) of the resolution filter 21, and the influence of those frequency bands are neglected, an intermediate frequency signal $IF_0(t)$ is expressed by the following equation (2).

$$IF_o(t)=f(t)\times\exp[-j(\sigma t^2+a\,t+\theta_o)] \quad (2)$$

If the $IF_0(t)$ is assumed to be directly inputted to the resolution filter 21, the final IF signal $IF_g(t)$ outputted from the resolution filter 21 is operessed by the following equation (3).

$$IFg(t) = IF_0(t)g(t) \quad (3)$$

$$IFg(t) = f(t)\times\exp[-j(\sigma t^2 + at + \theta_0)] * g(t)$$

$$IFg(t) = \int_{-\infty}^{\infty} f(\tau)\exp[-j(\sigma\tau^2 + a\tau + \theta_0)]g(t-\tau)d\tau$$

In the equation (3), $\sigma=0$, $L(t)=\exp[-jat]$ (frequency is constant).
When the band characteristic h(t) of the intermediate frequency filter 14 is a delta function $\delta(\omega)$ in frequency domain and h(t) is h(t)=1: condition (A), $$IFg(t) = \int_{-\infty}^{\infty} f(\tau)e^{-j(a\tau+\theta_0)}d\tau \quad (4)$$

$$= F\left(\frac{-a}{2\pi}\right)$$

the above equation (4) is obtained. This is nothing but the Fourier transformation result of a signal to be measured f(t) inputted to the input terminal 11.

The equation (4) shows that IFL(t) is the frequency component at the local oscillation frequency $(-a/2\pi)$ without relating to time. However, this is true only when the condition (A) is satisfied. In reality, $\sigma$ is not zero, and g(t) is not a $\delta$ function. Therefore, some errors must be accepted.

When a plurality of time-to-frequency converting apparatus 18 are connected in cascade, the frequency a in the equation (4) is only shifted.

Here, assuming that an inverse chirp signal u(t) for offsetting the frequency sweep of the main local oscillator 13 is expressed by the following equation (5), $$u(t)=\exp[j\,\sigma(t-t_0)^2] \quad (5)$$

and $IF_0(t)$ is multiplied by u(t) for a time point $t_0$ as a center, the following equation (5') is obtained.

$$I\,F\,u\,(t)=f(t)\times\exp[-j(a+2\sigma t_0)t+\theta_0-\sigma t_0^2)] \quad (5')$$

Further, the band characteristic g(t) of the resolution filter 21 is applied to the equation (5') for the time point $t_0$ as a center.

$$IFg(t_0) = \int_{-\infty}^{\infty} f(t)\exp[-j((a + 2\sigma t_0)t + \theta_0 - \sigma t_0^2)]g(t-t_0)dt \quad (6)$$

$$IFg(t_0) = F(a + 2\sigma t_0) * G(a + 2\sigma t_0) \times \exp[j(\sigma t_0^2 - \theta_0)]$$

Therefore, IFg(t) is observed as a convolution of the frequency characteristic (Fourier transformation result of g(t)) $G(\omega)$ into the Fourier transformation result of the signal to be measured f(t). This does not depend on time point t, but depends on the central time point $t_0$ for which the inverse chirp is applied (refer to FIG. 11).

An absolute value of IFg(t) is nothing but a power spectrum of the signal to be measured f(t).

In the conventional analog sweep method, the sweep rate must be reduced inversely proportional to square of a resolution bandwidth of the band characteristic g(t) of the resolution filter 21. However, according to the present invention, a sweep rate (bandwidth of h(t))/(bandwidth of g(t)) times higher than the above rate is possible.

Next, the inverse chirp correction device 25 will be described using equations. An intermediate frequency signal $IF_0(t)$ to be inputted to the inverse chirp correction device 25 is a chirp signal in which, the frequency is increased proportionally to time and the phase is a quadratic function of time. This was already shown by the above equation (2).

In the prior art, the signal of the equation (2) is multiplied by the band characteristic g(t) of the resolution filter 2 1, and the multiplication output is defmed as a frequency component.

A time response function of a Gaussian filter having a RBW of 3 dB bandwidth is expressed by equation (7).

$$g(t)=A\times\exp[-a\cdot RBW^2\cdot t^2] \quad (7)$$

In the above equation (7), the value of "a" is experimentally obtained. Here, it is assumed that a is a=3.4. In addition, the value of A is a constant for power calibration, and is experimentally determined depending on the measuring system.

$$-\frac{1}{RBW} \approx -tg < t < tg \approx \frac{1}{RBW} \quad (8)$$

In the range shown by the above equation (8) the function in equation (7) is applied, and outside this range, zero is applied. Thus, the above equation (7) can be approximated. The range of (8) may be appropriately changed in accordance with the measurement dynamic range required.

Either the process of the equation (7) for applying the Gaussian filter characteristic to the chirp signal (intermediate frequency signal) $IF_0(t)$ shown in the equation (2) or the process of the following equation (9) may be performed first. However, it is most efficient to process those equations in one lot as the functions to be executed at the same time. In this case, similarly to the case of the equation (7), the process is performed assuming that for the range outside the range shown by the equation (8), zero is applied.

$$g_{uo}(t)=A\times\exp[-a\times RBW^2 t^2+j\sigma t^2] \quad (9)$$

When the equation (2) is integrated for the time point $t_0$ as the center, the spectrum components at time point $t_0$ can be obtained.

$$IFg(t_0) = \int_{t_0-\frac{1}{RBW}}^{t_0+\frac{1}{RBW}} IF_0(t)\times g_{uc}(t-t_0)dt \quad (10)$$

$$= \int_{t_0-\frac{1}{RBW}}^{t_0+\frac{1}{RBW}} [\{f(t)\times\exp[-j(\sigma t^2 + at + \theta_0)]\}\times$$

$$g(t-t_0)\exp[j\sigma(t-t_0)^2]]dt$$

-continued $$= \int_{t_0-\frac{1}{RBW}}^{t_0+\frac{1}{RBW}} [f(t) \times g(t-t_0) \exp[-j\{(a+2\sigma t_0)t + \theta_0 - \sigma t_0^2\}]] dt$$

$$= \int_{t_0-\frac{1}{RBW}}^{t_0+\frac{1}{RBW}} [f(t) \times g(t-t_0) \exp[-j\{(a+2\sigma t_0)t + \theta_0 - \sigma t_0^2\}]] dt$$

$$= F(a+2\sigma t_0) * G(a+2\sigma t_0) \exp[-j(\theta_0 - \sigma t_0^2)]$$

Thus, the same result as the equation (6) is obtained (F and G are Fourier transformation results of f and g, respectively).

Next, the reason why a high rate sweep can be made according to the present invention will be described.

The description will be made using the examnples of SPAN=10 KHz, RBW=100 Hz, Sweep Time=15 msec. The intermediate frequency signal $IF_0(t)$ outputted from the time-to-frequency converting apparatus 18 can be expressed as follows from the equation (2).

$$I F_0 (t) = f(t) \times \exp[-j(\sigma t^2 + a\, t + \theta_0)]$$

When RBW is RBW=100 Hz, the response time is approximatny 20 msec.

The output of the resolution filter 21 at time point $t_0$ is given as follows from the equation (10).

$$IFg(t_0) = \int_{t_0-\frac{1}{RBW}}^{t_0+\frac{1}{RBW}} IF_0(t) \times g(t-t_0) dt$$

Since the response time of resolution filter 21 is approximately 20 msec., the filter reacts in the entire Sweep Time=15 msec. As a result, the spectrum is expanded, as shown by the curve C in FIG. 12, from the primary band characteristic 100 Hz of the resolution filter 21.

In order to prevent the apparent RBW from being expanded, a frequency change of the intermediate frequency signal IFg(t) within the response time of the band characteristic g(t) of the resolution filter 21 must sufficiently be smaller than the bandwidth of the g(t).

The limit of the sweep rate is defined as $0.5 \times RBW^2$ by various literature. On the other hand, when the inverse chirp correction process is applied to the chirp signal $IF_0(t)$, the signal frequency is the frequency $f_C$ (FIG. 2) at time point $t_0$. The signal is given as the following, as shown in the equation (5').

$$IFu\ (t) = f(t) \times \exp[-j\{(a+2\sigma t_0)t + \theta_0 - \sigma t_0^2\}]$$

If this equation is multiplied by the Gaussian filter characteristic, the following equation (11) can be obtained. This equation (11) represents a spectrum.

$$IFg(t_0) = \int_{-\infty}^{\infty} f(\tau) \exp[-k\{(a+2\sigma t_0)\tau + \theta_0 - \sigma t_0^2\}]g(t_0-\tau) d\tau \quad (11)$$

The equation (5') is a frequency-shifted replica of the signal to be measured f(t). If the signal to be measured f(t) is a sine wave, the signal of the equation (5') is also a sine wave. If the Gaussian filter characteristic is applied to this signal, the over sweep phenomenon indicated by the curve C in FIG. 12 does not occur. In order for the equation (11) to be a sine wave signal, the sweep rate a is not directly involved. When the sweep rate a is increased, the intermediate frequency signal for obtaining a spectrum can be acquired in shorter time. However, the sweep rate can not be increased unlimitedly but a condition must be satisfied such that in the equation (11), within the response time of the band characteristic of the Gaussian filter, the maximum absolute value of the chirp frequency must be equal to or less than the Nyquist frequency determined by a sample frequency fs of the AD converter 19.

The response time of the Gaussian filter is assumed to be 2/RBW. It is sufficient that the bandwidth of the local oscillator 13 within this response time period is narrower than the passband width of the data selecting apparatus 42. Of course, this means that the bandwidth of the Gaussian filter must be narrower than Nyquist frequency of the AD converter 19 or the data selecting apparatus 42. As the specific values, the bandwidth can be defined as ¼ to ½ of the sampling frequency in the AD converter 19 or the data selecting apparatus 42. If this bandwidth is assumed to be Bd, the local oscillator 13 can frequency-sweep over the bandwidth Bd within the time length 2/RBW. That is, the sweep rate is a value of Bd divided by (2/RBW).

As a result, sweep rate=Bd÷(2/RBW)=0.5Bd×RBW is obtained.

As described above, according to the present invention, since $RBW^2$ is not present in the equation for defining the frequency sweep rate of the main local oscillator 13, it is not required that the sweep rate is slowed down extremely even if the bandwidth RBW of the resolution filter 21 is set to narrow band, and the resolution is set to high resolution.

For example, in the case of Bd=10 KHz, and RBW=10 Hz, higher sweep rate of about 1000 times greater than that of the conventional sweep type spectrum analyzer can be obtained as compared with the conventional sweep type spectrum analyzer. In the case of Bd=10 KHz, and RBW=1 Hz, higher sweep rate of about 10,000 times greater can be obtained.

In such a way, according to the present invention, a fatal defect of the sweep type spectrum analyzer can be eliminated, and the effect in the practical use is very large.

While the present invention has been described with respect to the preferred embodiments illustrated herein, it will be apparent to those skilled in the art that various changes, alterations, modifications and minor improvements may be made to the embodiments described above without departing from the spirit and scope of the present invention. Accordingly, it should be understood that the present invention is not to be limited to the illustrated embodiments but encompasses all changes, alterations, modifications and minor improvements falling within the scope of the invention defined by the appended claims.

What is claimed is:

1. A frequency analysis method comprising the steps of:
   multiplying a signal to be measured by a main swept-frequency signal;
   extracting the result of the multiplication through an intermediate frequency filter having a bandpass width to extract frequency components included in said signal to be measured as intermediate frequency signals;
   multiplying each intermediate frequency signal by an inverse swept-frequency signal, said inverse swept-frequency signal having a frequency-sweeping span in which the frequency of the inverse swept-frequency signal changes in a direction inverse to that of changes in frequency of the associated intermediate frequency signal;

extracting signal components having a constant frequency obtained from the results of the multiplications of the intermediate frequency signals by said inverse swept-frequency signal as a frequency spectrum included in the signal to be measured; and analyzing the frequency components included in said signal to be measured based on a correspondence between a level of each of the intermediate frequency signals and a frequency of said main swept-frequency signal.

2. The frequency analysis method according to claim 1, wherein the frequency-sweeping span of said inverse swept-frequency signal is narrower than the passband width of said intermediate frequency filter, the inverse swept-frequency signal sweeping through said frequency-sweeping span a plurality of times without intermission during one sweep of the main swept-frequency signal.

3. The frequency analysis method according to claim 1 or 2, wherein said signal component having a constant frequency obtained from the results of the multiplications is a signal component the frequency of which coincides with the center frequency of a resolution filter.

4. A sweep type spectrum analyzer comprising:
   a time-to-frequency converter, said time-to-frequency converter comprising a local oscillator for generating a main swept-frequency signal; a first multiplier that multiplies the main swept-frequency signal generated from said local oscillator by a signal to be measured; and an intermediate frequency filter having a bandpass width, and being arranged such that a frequency component included in the signal to be measured is frequency-discriminated in accordance with a lapse of time associated with a sweep of the main swept-frequency signal thereby converting the frequency-discriminated components to intermediate frequency signals arranged by frequency according to the lapse of time;
   a second multiplier for multiplying each of the intermediate frequency signals outputted from said time-to-frequency converter by an inverse swept-frequency signal, said inverse swept signal having a frequency-sweeping span in which the frequency of the inverse swept-frequency signal changes in a direction inverse to that of changes in frequency of the associated intermediate frequency signal; and
   a resolution filter supplied with the results of the multiplications of said second multiplier for extracting a signal component having a constant frequency,
   wherein each signal extracted through said resolution filter is displayed on a display device as a frequency spectrum included in the signal to be measured.

5. The sweep type spectrum analyzer according to claim 4, wherein said inverse swept-frequency signal is generated from a secondary local oscillator, the frequency-sweeping span of the inverse swept-frequency signal is narrower than the passband width of said intermediate frequency filter, the multiplication of the inverse swept-frequency signal by the intermediate frequency signal is repeated a plurality of times during one sweep of the main swept-frequency signal, and each of the results of the multiplications is supplied to said resolution filter.

6. The sweep type spectrum analyzer according to claim 4 or 5, wherein the signal component having the constant frequency extracted through the resolution filter is a signal component the frequency of which coincides with the center frequency of the resolution filter.

7. A sweep type spectrum analyzer comprising:
   a time-to-frequency converter, said time-to-frequency converter comprising a local oscillator for generating a main swept-frequency signal; a first multiplier for multiplying the main swept-frequency signal generated from said local oscillator by a signal to be measured; and an intermediate frequency filter having a bandpass width, and being arranged such that a frequency component included in the signal to be measured is frequency-discriminated in accordance with a lapse of time associated with a sweep of the main swept-frequency signal thereby converting the frequency-discriminated components to intermediate frequency signals arranged by frequency according to the lapse of time; and
   a plurality of inverse chirp correction units provided in parallel with each other, each of said inverse chirp correction units comprising:
      a second multiplier for multiplying each of the intermediate frequency signals outputted from said time-to-frequency converter by an inverse swept-frequency signal, said inverse swept signal having a frequency-sweeping span in which the frequency of the inverse swept-frequency signal changes in a direction inverse to that of changes in frequency of the associated intermediate frequency signal;
      a resolution filter supplied for extracting a signal component having a constant frequency from a signal outputted from said second multiplier;
      a detector for detecting the signal component extracted through the resolution filter; and
      a sample-and-hold circuit for sampling and holding the detected output from said detector at the end of each sweep of the inverse swept-frequency signal;
   wherein said plurality of inverse chirp correction units are sequentially operated with a time difference therebetween, and sample-hold signals of the sample-and-hold circuits are sequentially outputted.

8. The sweep type spectrum analyzer according to claim 7, wherein the output signal from the sample-and-hold circuit of each of the plurality of inverse chirp correction units is inputted into the vertical axis of a display device, and a sawtooth wave in synchronism with the main swept-frequency signal is inputted into the horizontal axis of the display device, thereby to display the frequency spectrum of a signal to be measured.

9. The sweep type spectrum analyzer according to claim 7, wherein in each of said plurality of inverse chirp correction units, said inverse swept-frequency signal is generated from a secondary local oscillator, the frequency-sweeping span of the inverse swept-frequency signal is narrower than the passband width of said intermediate frequency filter, the multiplication of the inverse swept-frequency signal by the intermediate frequency signal is repeated a plurality of times during one sweep of the main swept-frequency signal, and each of the results of the multiplications is supplied to said resolution filter.

10. The sweep type spectrum analyzer according to claim 7 or 9, wherein the signal component having the constant frequency extracted through the resolution filter is a signal component the frequency of which coincides with the center frequency of the resolution filter.

11. A sweep type spectrum analyzer comprising:
   a time-to-frequency converter, said time-to-frequency converter comprising a local oscillator for generating a main swept-frequency signal; a first multiplier for multiplying the main swept-frequency signal generated from said local oscillator by a signal to be measured; and an intermediate frequency filter having a bandpass width, and being arranged such that a frequency component included in the signal to be measured is frequency-discriminated in accordance with a lapse of time associated with a sweep of the main swept-frequency signal thereby converting the frequency-discriminated components to intermediate frequency signals arranged by frequency according to the lapse of time;

a quadrature detector provided at the output side of said time-to-frequency converter; and a plurality of inverse chirp correction units provided in parallel with each other at the output side of said quadrature detector, each of said inverse chirp correction units comprising:

a pair of second multipliers for multiplying an inverse swept-frequency signal by a real part signal and by an imaginary part signal outputted from said quadrature detector, respectively, said inverse swept signal having a frequency-sweeping span in which the frequency of the inverse swept-frequency signal changes in a direction inverse to that of changes in frequency of the associated intermediate frequency signal;

a pair of low-pass filters each constituting a resolution filter, each of said low-pass filters extracting a base band signal obtained from the result of the multiplication of the associated second multiplier;

a pair of squaring circuits for squaring the output signals from said pair of low-pass filters;

an adder for summing up the results of said pair of squaring circuits to find a power of a frequency spectrum included in the signal to be measured;

a detector for detecting the result of the addition of said adder; and a sample-and-hold circuit for sampling and holding the detected output from said detector at the end of each sweep of the inverse swept-frequency signal;

wherein said plurality of inverse chirp correction units are sequentially operated with a time difference therebetween, and sample-hold signals of the sample-and-hold circuits are sequentially outputted.

12. The sweep type spectrum analyzer according to claim 11, wherein the output signal from the sample-and-hold circuit of each of the plurality of inverse chirp correction units is inputted into the vertical axis of a display device, and a sawtooth wave in synchronism with the main swept-frequency signal is inputted into the horizontal axis of the display device, thereby to display the frequency spectrum of a signal to be measured.

13. The sweep type spectrum analyzer according to claim 11, wherein in each of said plurality of inverse chirp correction units, said inverse swept-frequency signal is generated from a secondary local oscillator, the frequency-sweeping span of the inverse swept-frequency signal is narrower than the passband width of said intermediate frequency filter, the multiplications of the inverse swept-frequency signal by the real part signal and by the imaginary part signal outputted from said quadrature detector are repeated a plurality of times during a sweep of the main swept-frequency signal, and each of the results of the multiplications is supplied to the associated low-pass filter.

14. A sweep type spectrum analyzer comprising:

a time-to-frequency converter, said time-to-frequency converter comprising a local oscillator for generating a main swept-frequency signal; a first multiplier for multiplying the main swept-frequency signal generated from said local oscillator by a signal to be measured; and an intermediate frequency filter having a bandpass width, and being arranged such that a frequency component included in the signal to be measured is frequency-discriminated in accordance with a lapse of time associated with a sweep of the main swept-frequency signal thereby converting the frequency-discriminated components to intermediate frequency signals arranged by frequency according to the lapse of time;

an analog-to-digital converter provided at the output side of said time-to-frequency converter and supplied with an intermediate frequency signal;

a quadrature detector supplied with a digital output from said analog-to-digital converter;

a memory for storing therein a digital output from said analog-to-digital converter obtained during the time interval of a sweep of the main swept-frequency signal;

an inverse chirp correction unit for performing an inverse chirp correction operation using the data stored in said memory; and a resolution filter supplied with an output signal from said inverse chirp correction unit;

wherein said quadrature detector, said memory, said inverse chirp correction unit, and said resolution filter are implemented by one or more digital circuits.

15. The sweep type spectrum analyzer according to claim 14, wherein a data selecting circuit comprising a decimation filter is provided between said quadrature detector and said inverse chirp correction unit.

16. The sweep type spectrum analyzer according to claim 14, wherein said inverse chirp correction unit and said resolution filter are implemented by an arithmetic and logic unit.

17. A frequency analysis method comprising the steps of:

multiplying an input signal having signal components of different frequencies to be measured by a main swept-frequency signal to obtain a first result of multiplying;

extracting an intermediate frequency signal containing the signal components included in said input signal from the first result of multiplying by an intermediate frequency filter having a bandpass width;

multiplying said intermediate frequency signal by a second swept-frequency signal to obtain a second result of multiplying, said second swept-frequency signal having a frequency-sweeping span in which the frequency of the second swept-frequency signal changes in a direction inverse to that of changes in frequency of said intermediate frequency signal;

extracting an output signal having a constant frequency component from the second result of multiplying by a resolution filter; and displaying an envelope of the output signal as a frequency spectrum of the signal components included in the input signal.

18. The frequency analysis method according to claim 17, wherein:

the frequency-sweeping span of said second swept-frequency signal is equal to or narrower than the passband width of said intermediate frequency filter; and the second swept-frequency signal is swept through said frequency-sweeping span a plurality of times without intermission during one sweep of the main swept-frequency signal.

19. A sweep type spectrum analyzer comprising:
a time-to-frequency converter that comprises:
- a main local oscillator for generating a main swept-frequency signal;
- a first multiplier that multiplies an input signal to be measured which contains signal components of different frequencies by the main swept-frequency signal and outputs a result of its multiplication; and
- an intermediate frequency filter connected to the first multiplier and having a bandpass width that outputs an intermediate frequency signal which contains the signal components in frequency-discriminated state arranged by frequency according to a lapse of time associated with a sweep of the main swept-frequency signal;

an inverse chirp correction unit that comprises:
- a second local oscillator for generating a second swept-frequency signal; and
- a second multiplier that multiplies the intermediate frequency signals outputted from said time-to-frequency converter by the second swept-frequency signal and outputs a result of its multiplication;
- a resolution filter supplied with the result of the multiplication of said second multiplier that extracts an output signal containing signal components having a constant frequency; and
- a display device that displays the signal components contained in the output signal of said resolution filter as a frequency spectrum included in the input signal.

20. The sweep type spectrum analyzer according to claim 19, wherein said second swept-frequency signal generated by the second local oscillator has a frequency-sweeping span that is narrower than the passband width of said intermediate frequency filter, and wherein the multiplication of the intermediate frequency signal by the second swept-frequency signal is repeated a plurality of times during one sweep of the main swept-frequency signal, and each of the results of the multiplications is supplied to said resolution filter.

* * * * *